(12) United States Patent
Ooishi

(10) Patent No.: US 6,829,171 B2
(45) Date of Patent: Dec. 7, 2004

(54) MEMORY DEVICE TRAPPING CHARGES IN INSULATING FILM TO STORE INFORMATION IN NON-VOLATILE MANNER

(75) Inventor: Tsukasa Ooishi, Hyogo (JP)

(73) Assignee: Renesas Technology Corp., Toyko (JP)

( * ) Notice: Subject to any disclaimer, the term of this patent is extended or adjusted under 35 U.S.C. 154(b) by 0 days.

(21) Appl. No.: 10/319,520

(22) Filed: Dec. 16, 2002

(65) Prior Publication Data

US 2003/0156457 A1 Aug. 21, 2003

(30) Foreign Application Priority Data

Feb. 18, 2002 (JP) ........................................ 2002-040051

(51) Int. Cl.[7] .............................................. G11C 16/06
(52) U.S. Cl. ............................ 365/185.21; 365/185.18; 365/185.2
(58) Field of Search .................... 365/185.21, 185.2, 365/210, 185.18

(56) References Cited

U.S. PATENT DOCUMENTS

| 6,011,725 | A | 1/2000 | Eitan | |
|---|---|---|---|---|
| 6,134,156 | A | 10/2000 | Eitan | |
| 6,438,034 | B1 | * 8/2002 | Tanzawa | 365/185.18 |
| 6,650,568 | B2 | * 11/2003 | Iijima | 365/185.18 |
| 2002/0196667 | A1 | * 12/2002 | Ikehashi et al. | 365/185.24 |

FOREIGN PATENT DOCUMENTS

JP    5-28781    2/1993

OTHER PUBLICATIONS

Boaz Eitan et al., Can NROM, a 2–bit, Trapping Storage NVM Cell, Give a Real Challenge to Floating Gate Cells?, International Conference on Solid State Devices and Materials, 1999, pp. 1/3–3/3.

Related U.S. Patent Application Ser. No. 10/203,963, filed Nov. 25, 2002, (Our Ref. No: 57454–800).

* cited by examiner

Primary Examiner—Huan Hoang
(74) Attorney, Agent, or Firm—McDermott Will & Emery LLP

(57) ABSTRACT

Dummy cells in an erased state and in a write state are used to generate a dummy current corresponding to the average current of currents flowing in the dummy cells using a ½ current generating circuit, and the dummy current is compared with a current corresponding to a memory cell current flowing in a selected normal cell using a current sense amplification circuit to generate internal read data according to a result of the comparison. With such a configuration, a non-volatile semiconductor memory device capable of reading data at high speed can be achieved.

19 Claims, 14 Drawing Sheets

MEMORY DEVICE TRAPPING CHARGES IN INSULATING FILM TO STORE INFORMATION IN NON-VOLATILE MANNER

BACKGROUND OF THE INVENTION

1. Field of the Invention

The present invention relates to a non-volatile semiconductor memory device, and particularly to a configuration for reading data at high speed in a non-volatile semiconductor memory device. More particularly, the present invention relates to a configuration for reading data in a non-volatile semiconductor memory device having insulating film charge trapping memory cells each accumulating charges in an insulating film.

2. Description of the Background Art

As a memory storing information in a non-volatile manner, there has been available a collective erasure type EEPROM (electrically erasable and programmable read only memory) having memory cells each constituted of a stacked gate field effect transistor. In the collective erasure type EEPROM or a flash memory, charges are accumulated in a floating gate, made of, for example, polysilicon, insulated from the surroundings and information is stored by altering a threshold voltage of a memory cell transistor according to an accumulated quantity of charges therein.

In the structure of such non-volatile memory cell utilizing a stacked gate field effect transistor, a large electrical stress is applied, in data rewriting, to a tunneling insulating film between a floating gate and a semiconductor substrate region, leading to degradation in the tunneling insulating film. If a defect occurs in such a tunneling insulating film, a charge accumulated in a floating gate is likely to leak out for causing destruction of storage data.

"An insulating film charge trapping non-volatile memory cell" accumulating charges in an insulating film is proposed, as a substitute for a cell structure of a stacked gate field effect transistor that uses a floating gate as a charge accumulating medium.

FIG. 12 is a diagram schematically showing a sectional structure of a conventional insulating film charge trapping memory cell. In FIG. 12, an insulating film charge trapping memory cell includes: buried diffusion layers 901a and 901b formed on a surface of a semiconductor substrate region 900; a multi-layer insulating film 903 formed between buried diffusion layers 901a and 901b; and an electrically conductive layer 904 formed on multi-layer insulating film 903. Diffusion layers 901a and 901b are formed extending in a column direction and used as bit lines. Conductive layer 904 is formed extending in a row direction, and used as a word line to transmit a row select signal and further as a control gate of a memory cell.

Multi-layer insulating film 903, though placed extending in the direction of a word line, is depicted in FIG. 12 as being separated for each memory cell in row direction, in order to emphasize a charge accumulating region of one bit memory cell.

Multi-layer insulating film 903 has a multi-layer structure composed of an oxide film, a nitride film and an oxide film, to accumulate charges in a region of the nitride film. Bit line insulating films 902a and 902b for isolation of adjacent memory cells are formed on diffusion layers 901a and 901b.

As will be detailed later, adjacent bit lines are isolated by bit line insulating films 902a and 902b without forming an insulating film for channel isolation. Channel isolation is achieved by a PN junction between a formed channel and a substrate region.

In the memory cell structure shown in FIG. 12, a mobility of a charge is small in the insulating film accumulating charges, and therefore, a charge accumulating region is extremely localized. Accordingly, as shown by regions at BT1 and BT2 in FIG. 12, two charge accumulating regions BT1 and BT2 can be formed in one memory cell, thereby enabling storage of 2 bit data in one memory cell.

FIG. 13 is a diagram schematically showing a planar layout of the memory cell shown in FIG. 12. In FIG. 13, there are shown three word lines WL0 to WL2 and three bit lines BL0 to BL2 as representatives. Word lines WL0 to WL2 extend in the row direction and are connected to memory cells arranged on respective rows. Bit lines BL0 to BL2 extend in the column direction and are connected to memory cells arranged on respective columns. Each of bit lines BL0 to BL2 is shared by memory cells adjacent to each other in the row direction.

Multi-layer insulating film 903 is placed in row direction in parallel to and below word line WL (denoting WL0 to WL2 generically). In FIG. 13, charge accumulating regions 905 formed of multi-layer insulating film 903 are shown being arranged between bit lines in a similar manner to the structure shown in FIG. 12, in order to emphasize a charge accumulating region of each memory cell. In FIG. 13, regions 905 hatched by oblique lines are used as charge accumulating regions. Therefore, a nitride film may be formed only in charge accumulating regions 905 hatched by oblique lines. In one charge accumulating region 905, there are formed effective charge accumulating regions (BT1 and BT2) in which charges corresponding to stored data are accumulated. The effective charge accumulating regions are referred to as right and left bit regions in the following description and data stored in these regions are referred to as a right bit and a left bit, respectively.

Bit lines BL0 to BL2 each shared by adjacent memory cells. With respect to one memory cell, one bit line is used as a data line for reading data and the other is used as a source line. A common bit line is used as a data line or a source line, depending on a data access target region.

As shown in FIG. 13, a bit line is just provided corresponding to each memory cell column, without a necessity of a dedicated source line. Dissimilar to a conventional stacked gate transistor cell structure, in which charges are accumulated in the polysilicon floating gate, no source line is required, thereby achieving a reduced occupation area of a memory cell. When a design minimum size is indicated F, for example, a pitch between bit lines is represented by 2×F and a pitch between word lines is also represented by 2×F. Accordingly, in FIG. 13, a memory cell region 910 represented by broken lines occupies an area of 2F×2F.

Since 2 bit data is stored in one memory cell region 910, an effective occupation area of a memory cell is $2 \times F^2$. Furthermore, by changing a quantity of electrons injected into the multi-layer insulating film, a threshold voltage can be changed over multiple levels to enable not only storage of multi-valued data but also more decrease in effective area of a memory cell.

Specifically, in a case where a quantity of injected charges in one effective charge accumulating region (the right bit region or the left bit region) is divided into two levels (a programmed state and an erased state), an effective occupation area of a memory cell is $2 \times F^2$. In a case where a quantity of injected charges in one effective charge accumulating region is divided into four levels, 2 bit data is stored in one effective charge accumulating region. 4 bit data is stored in one memory cell, and an effective occupation area of a memory cell is $1 \times F^2$. In a case where an injected charge quantity in an effective charge accumulating region is set over eight levels, an effective occupation area of a memory cell is $0.5 \times F^2$.

Referring to FIG. 14, description will now be given of a write (programming) and read operations of data. In FIG. 14, binary data is stored in each of right bit region BT1 and left bit region and BT2. Multilayer insulating film 903, as shown in FIG. 14, includes: a lower side oxide film 903a formed on the surface of semiconductor substrate region 900; a nitride film 903b formed on lower side oxide film 903a; and an upper side oxide film 903c formed on nitride film 903b. Charges are accumulated in nitride region 903b.

Electrically conductive layer (referred to as conductive layer or gate electrode layer hereinafter) 904 functions as a control gate of a memory cell and receives a signal from a word line select circuit not shown.

When electrons are accumulated in right bit region BT1, a voltage of, for example, 9V is applied to control gate (gate electrode layer) 904 and a voltage in the range from 4.5 to 6 V is applied to a diffusion bit line region (impurity region) 901b. Diffusion bit line region (impurity region) 901a is set to ground voltage level. In this state, a channel is formed at the surface of substrate region 900 according to a voltage applied to gate electrode layer 904 and a current I flows from diffusion bit line region 901b toward diffusion bit line region 901a. A current I flowing in the channel region is accelerated by the voltage applied to gate electrode layer 904 in a vertical direction and electrons are injected into and stored in nitride film 903b. Thus, electrons are accumulated in right bit region BT1. In nitride film 903b, an electron mobility is small and therefore right bit region BT1 is formed only in a region in the vicinity of the drain region in self-alignment with the drain region.

On the other hand, when electrons are accumulated in left bit region BT2, diffusion bit line region 901a is supplied with a voltage of in the range from 4.5 to 6 V while diffusion bit line region 901b is set to ground voltage level. Gate electrode layer 904 is supplied with a voltage of 9V. In this case, a current flows from diffusion bit line region 901a to diffusion bit line region 901b and hot electrons generated by a drain high electric field are accelerated by a voltage applied to gate electrode layer 904 and stored in nitride film 903b. Thereby, electrons are accumulated in left bit region BT2.

That is, in program operation, channel hot electrons (CHE) are generated and trapped in nitride film 903b. The state where electrons are injected into the charge accumulating region is referred to as a programmed state (a written state). In programmed state, since electrons are injected in an effective charge accumulating region, a threshold voltage of a memory cell transistor rises in that region.

In data reading, a current I is caused to flow in a memory cell in a direction opposite to that in program operation as shown with an arrow in FIG. 14. That is, when stored data in right bit region BT1 is read out, diffusion bit line region 901a is supplied with a voltage, for example, in the range from 1.5 to 2 V while diffusion bit line region 901b is set to ground voltage level. Gate electrode 904 is supplied with a voltage of, for example, 4 V. In this case, a punch-through is caused due to a widened depletion layer in left bit region BT2 and a threshold voltage in a region in the vicinity of left bit region BT2 exerts no influence on a read current.

In other words, when a current flows from diffusion bit line region 901a to diffusion bit line region 901b in data read operation, a current quantity flowing through the channel region is determined according to a quantity of electrons accumulated in right bit region BT1. Thereby, data stored in right bit region BT1 can be read out.

When data stored in left bit region BT2 is read out, diffusion bit line region 901b is supplied with a voltage in the range from 1.5 to 2 V while diffusion bit line region 901a is set to ground voltage level. Gate electrode layer 904 is supplied with a voltage of the order of 4V. In this case, in a region in the vicinity of right bit region BT1 at the substrate surface region punch-through is caused at the surface of the substrate region and merely the depletion layer is widened. A current flows between diffusion bit lines 901b and 901a according to a quantity of electrons accumulated in left bit region BT2. By detecting a magnitude of the current, data stored in left bit region BT2 can be read out.

Generally, a direction in which a current flows in programming in a memory cell is referred to as a forward direction and a direction in which a current flows in data reading in the memory cell is referred to as a reverse direction. In FIG. 14, as shown by arrows, a relationship between forward and reverse directions for right bit line region BT1 is inverted for left bit line region BT2.

In an operating mode of erasing stored data, various kinds of erase methods have been proposed. One method is that a current is caused to flow in the reverse direction to produce channel hot holes, to inject the channel hot holes into a nitride film, and to recombine accumulated electrons and hot holes with each other to neutralize stored electrons. A second method is that a voltage is applied between nitride film 903b and gate electrode layer 904 to extract electrons accumulated in nitride film 903b through gate electrode layer 904. Since gate electrode layer 904 constitutes a word line and is driven by a row select circuit not shown, electrons are eventually extracted by the row select circuit in the second method. A third method is that a current is caused to flow between nitride film 903b and a drain region (a diffusion bit line) by a (inter-band) tunneling current to extract electrons from nitride film 903b. As for an erase operation, any of erase methods may be employed.

FIG. 15 is a diagram showing an electrically equivalent circuit of a memory cell and applied voltages in program operation. In FIG. 15, memory cells arranged in two rows and three columns representatively. In FIG. 15, a memory cell MC is constituted of a floating gate transistor. In the floating gate transistor, the floating gate is formed not with polysilicon but with nitride film (903b). Word lines WLa and WLb are provided corresponding to the respective memory cell rows and bit lines BLa to BLc are provided corresponding to the respective memory cell columns.

Now, consideration is given to a program operation on right bit region BT1 of memory cell MC1 placed, corresponding to word line WLb, between bit lines BLb and BLc. Data writing (programming) is performed by flowing a current in the forward direction. In this case, bit line BLc is supplied with a voltage in the range from 4.5 to 6 V while bit line BLb is held at ground voltage level. Bit line BLa is maintained in a floating state. Word lines WLa and WLb are set to 0 V and 9 V, respectively. In this state, in memory cell MC1, a current flows from bit line BLc to bit line BLb to produce channel hot electrons, e, and the electrons, e, are stored in right bit region BT1.

In memory cell MC2 adjacent to memory cell MC1 in the row direction, bit line BLa is in the floating state and no channel current flows, and therefore no channel hot electron is produced and no programming is performed.

In memory cell MC3 adjacent to memory cell MC1 in the column direction, word line WLa is maintained at ground voltage level, a memory cell transistor maintains a non-conductive state, no channel current flows and no programming is performed.

In a configuration in which a bit line is shared by memory cells adjacent to each other in the row direction as well, programming can be correctly performed only on a memory cell of programming target.

FIG. 16 is a diagram showing applied voltages in data reading in the memory arrangement of FIG. 15. In FIG. 16, when data stored in right bit region BT1 of memory cell MC1 is read, bit line BLb is supplied with a voltage in the range from 1.5 to 2 V, while bit line BLc is set to ground voltage level. Bit line BLa is maintained in the floating state. Word lines WLa and WLb are set to 0 V and 4 V, respectively. In this state, a current I flows from bit line BLb to bit line BLc according to a quantity of electrons accumulated in right bit region BT1 of memory cell MC1. A magnitude of the current I is detected to read data stored in right bit region BT1.

In this case, bit line BLa is in floating state and no current flows in memory cell MC2 even if a read voltage in the range from 1.5 to 2 V is applied onto bit line BLb. Therefore, a current I of a magnitude according to data stored in right bit region BT1 of memory cell MC1 can be caused to flow with correctness.

When data in left bit region BT2 (left bit) of memory cell MC1 is read out, bit line BLc is supplied with a voltage in the range from 1.5 to 2 V, while bit line BLb is supplied with ground voltage.

FIG. 17 is a diagram schematically showing a configuration of data reading section in a conventional non-volatile semiconductor memory device. In FIG. 17, the data reading section includes; a constant current source 920 coupled with a bit line BL corresponding to a selected column through column select gate 915 to supply a read voltage to selected bit line BL together with a constant current IR in data reading; a capacitive element 921 charged by a shunt current Is from constant current source 920; and an amplification circuit 922 producing internal read data RD according to a charged voltage of capacitive element 921. Amplification circuit 922 is constituted of, for example, a differential amplification circuit and compares a charged voltage of capacitive element 921 with a prescribed reference voltage to produce binary read data RD.

Bit line BL is connected to a virtual source line VSL through memory cell MC. Virtual source line VSL is constituted of a bit line BL of an adjacent column and virtual source line VSL, in data reading, is maintained at ground voltage level.

In the configuration of the internal data reading section shown in FIG. 17, a current Ib flowing from bit line BL to virtual source line VSL changes in magnitude according to stored data of memory cell MC. In response, a magnitude of current Is flowing to capacitive element 921 changes. Therefore, a voltage of capacitive element 921 charged in a prescribed period changes according to a stored data of memory cell MC. By detecting a charged voltage of capacitive element 921 in amplification circuit 922 to amplify, internal data RD is produced. In FIG. 17, capacitive element 921 is discharged to ground voltage level through a discharging switch not shown once prior to data reading.

FIG. 18 is a graph roughly showing a correspondence relationship between a charged voltage of capacitive element 921 shown in FIG. 17 and a read data from a memory cell. In FIG. 18, the ordinate indicates a voltage V, while the abscissa indicates a time t.

When a selected memory cell MC is in the erased state, a threshold voltage thereof is low and a comparatively large current Ibe flows. Therefore, a major part of constant current IR from constant current source 920 flows through memory cell MC, and a charging current Ise to capacitive element 921 is small. When memory cell MC is in erased state, charged voltage Vse of capacitive element 921 rises slowly.

When selected memory cell MC is in the programmed state, a threshold voltage thereof is high and only a small current Ibp flows as bit line current Ib. In this case, comparatively large current Isp flows from constant current source 920 to capacitive element 921 to raise greatly charged voltage Vsp of capacitive element 921.

Usually, in a memory cell in erased state, a current of about 40 $\mu$A flows, while in a memory cell in programmed state, a current of about 5 $\mu$A flows.

In order to discriminate between two states of erased sate and programmed state, amplification circuit 922 is activated when a potential difference between the two states increases sufficiently. In FIG. 18, there is shown a case where amplification circuit 922 is activated at time point t0. At time point t0, a large potential difference occurs between when data in the erase state is read out and when data in programmed state is read out, and therefore, stored data in a memory cell can be read stably.

A current flowing through memory cell MC, however, is on the order of $\mu$A. Therefore, a time period till t0, or the charging time for the capacitive element 921 has to be set sufficiently long, in order to read out data correctly in consideration of a sufficient margin. Hence, there is a problem that read data cannot be produced at high speed and a high speed access can not be achieved.

Especially, in a case where a read sequence is used in which one bit memory cell is selected and 2-bit data stored in the one bit memory cell is consecutively read out internally to output the data in parallel external, a problem arises that such a multi-valued data cannot be read out at high speed.

In a configuration where in data reading, capacitive element 921 is precharged to a prescribed voltage and a current is supplied into a selected bit line according to a charged voltage of capacitive element 921 as well, a necessity arises for delayed activation of amplification circuit 922, in order to discriminate sufficiently in the charged voltage level of a capacitive element between the programmed state and the erased state of a memory cell, resulting in a similar problem,

SUMMARY OF THE INVENTION

It is an object of the present invention to provide a non-volatile semiconductor memory device capable of reading data at high speed.

It is another object of the present invention to provide a non-volatile multi-valued memory capable of reading internal data at high speed.

It is a specific object of the present invention to provide a non-volatile semiconductor memory device of an insulating film charge trapping memory cell structure capable of reading internal data at high speed.

A non-volatile semiconductor memory device according to a first aspect of the present invention includes: a plurality of non-volatile memory cells, arranged in rows and columns, each for storing data in a non-volatile manner. Each non-volatile memory is configured of an insulated gate transistor having a threshold voltage set according to stored data. The threshold voltage attains at least a first state corresponding to a data at a first logical level and a second state corresponding to data at a second logical level.

The non-volatile semiconductor memory device according to the first aspect of the present invention further includes: a plurality of bit lines provided corresponding to respective memory cell columns, and connected to memory cells on the respective corresponding columns; a read current generating circuit, in data reading, for supplying a current into a bit line of a selected column; and a reference current generating circuit for generating a reference current. The reference current has a magnitude of the average of a first read current flowing through the bit line of a selected column when a memory cell in the first state is selected and a second read current flowing through the bit line of a selected column when a memory cell in the second state is selected, with respect to the read current corresponding to a current flowing into the bit line of the selected column from the read current generating circuit.

The non-volatile semiconductor memory device according to the first aspect of the present invention further includes: a comparison circuit for comparing the reference current from the reference current generating circuit with a read current from the read current generating circuit to generate a signal corresponding to a result of the comparison; and an internal read circuit for generating internal read data according to an output signal of the comparison circuit.

A non-volatile semiconductor memory device according to a second aspect of the present invention includes: a plurality of non-volatile memory cells, arranged in rows and columns, each for storing data in a non-volatile manner. Each non-volatile memory cell has an insulated gate transistor having a threshold voltage set according to stored data. A threshold voltage of each memory cell attains at least a first threshold voltage corresponding to stored data at a first logical level and a second threshold voltage corresponding to stored data at a second logical level.

The non-volatile semiconductor memory device according to the second aspect of the present invention further includes: a plurality of bit lines provided corresponding to respective memory cell columns, and connected to memory cells on the corresponding columns; and a reference current generating circuit for generating a reference current. The reference current has a magnitude of the average, in data reading, of a first current flowing through a memory cell having the first threshold voltage when the memory cell having the first threshold voltage is selected and a second current flowing through a memory cell having the second threshold voltage when the memory cell having the second threshold voltage is selected.

The non-volatile semiconductor memory device according to the second aspect of the present invention further includes: a constant current generating circuit for generating a constant current having a prescribed magnitude; a comparison circuit for supplying the constant current into a bit line of a selected column as read current to generate a signal corresponding to a difference between the read current and the reference current; and an internal read circuit for generating internal read data according to an output signal of the comparison circuit.

A non-volatile semiconductor memory device according to a-third aspect of the present invention includes: a plurality of non-volatile memory cells, arranged in rows and columns, each including a memory transistor having a threshold voltage changed according to stored data; a plurality of bit lines provided corresponding to the memory cell columns, and connected to memory cells on the corresponding columns; a read current supply current circuit for supplying a current into a bit line of a selected column; a reference current generating circuit for generating a reference current; and a comparison circuit for comparing a current flowing through a memory cell on the selected column with the reference current, to generate a signal indicating a result of the comparison.

A non-volatile semiconductor memory device according to a fourth aspect of the present invention includes: a plurality of non-volatile memory cells, arranged in rows and columns, each including a transistor having a threshold voltage set according to stored information, and each storing information in a non-volatile manner; a plurality of bit lines, provided corresponding to the memory cell columns and connected to memory cells on the corresponding columns, each being shared by memory cells on adjacent columns; a current supply circuit coupled to a first bit line of a selected column to supply a current into the first bit line; and a sense amplifier coupled to a second bit line of the selected column to generate internal read data according to a current flowing through the second bit line.

A non-volatile semiconductor memory device according to a fifth aspect of the present invention includes: a plurality of non-volatile memory cells, arranged in rows and columns, each including a transistor having a threshold voltage set according to stored information and storing information in a non-volatile manner; a plurality of bit lines, provided corresponding to the memory cell columns and being shared by memory cells on adjacent columns, connected to memory cells on the corresponding columns; a current supply circuit coupled to a first bit line of a selected column to supply a current into the first bit line; a reference power supply coupled to a second bit line of the selected column; and a sense amplifier coupled to the first bit line in parallel to the current supply circuit to generate internal read data according to an applied current.

By performing reading of internal data with a current sensing scheme in data reading, there is no need to consider a margin for a charging time for a capacitive element, thereby enabling execution of reading of internal data at high speed.

By generating a current having an intermediate value between two values of stored data in a memory cell as a reference current to compare the reference current with a read current flowing in the memory cell in selection of a memory cell, stored data in the memory cell can be correctly determined. The same margin can be secured for data corresponding to erase state and for data corresponding to programmed state, thereby enabling determination of a logical level of read data stably at high speed.

By detecting a current flowing from the first bit line to the second bit line through a memory cell, a current corresponding to a state of a selected memory cell can be correctly detected, thereby enabling reading memory cell data internally at high speed.

By coupling the sense amplifier to a bit line of a selected column in parallel to the current supply circuit to detect a current from the current supply circuit in the sense amplifier, a current corresponding to a current flowing in a selected memory cell can be supplied to the sense amplifier, thereby enabling reading stored data in a memory cell correctly at high speed.

The foregoing and other objects, features, aspects, and advantages of the present invention will become apparent from the following detailed description of the present invention when taken in conjunction with the accompanying drawings.

DESCRIPTION OF THE PREFERRED EMBODIMENTS

[First Embodiment]

Figure 1:
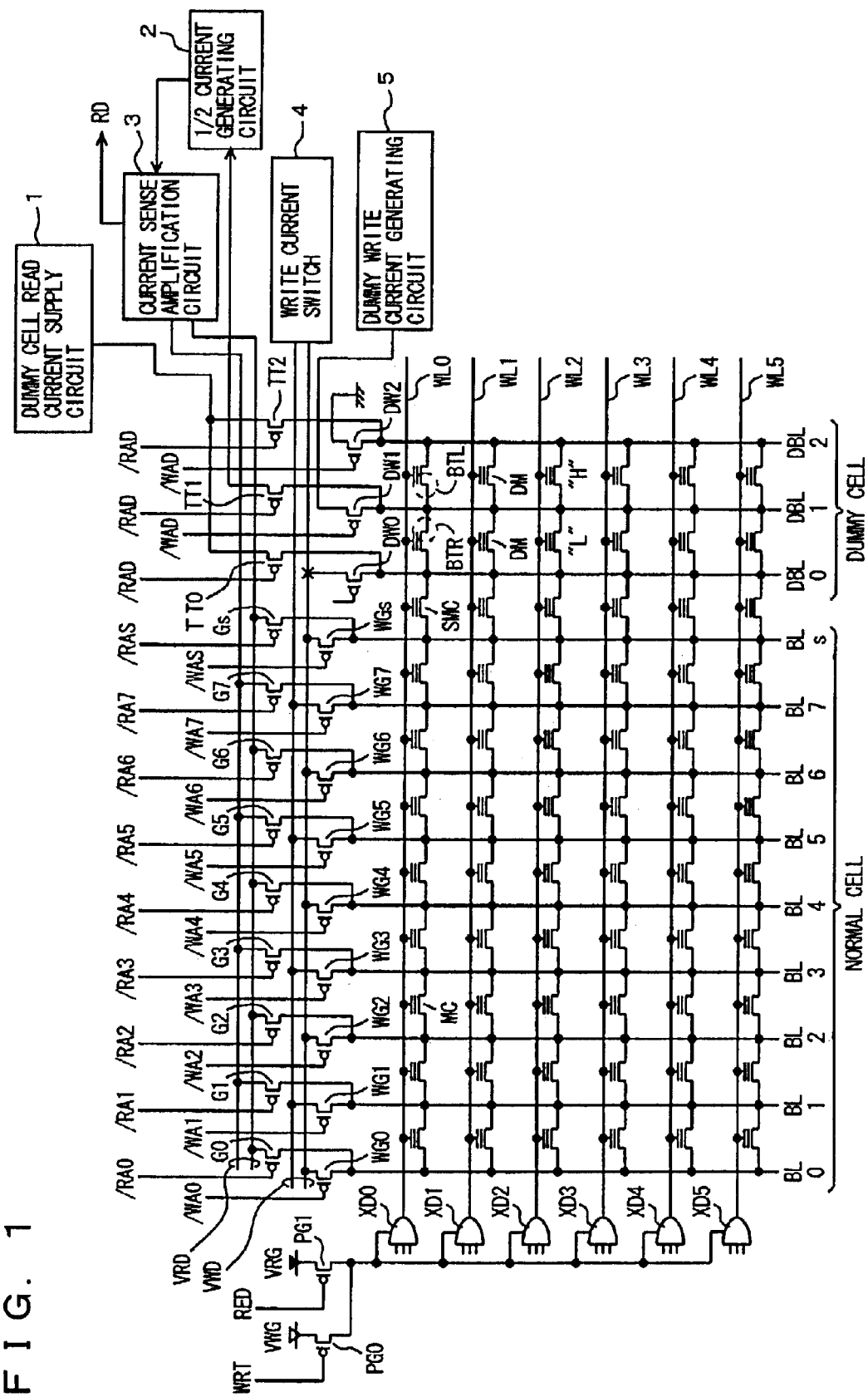
FIG. 1 is a diagram schematically showing a configuration of a main part of a non-volatile semiconductor memory device according to a first embodiment of the present invention.

FIG. 1 is a diagram schematically showing a configuration of a main part of a non-volatile semiconductor memory device according to a first embodiment of the present invention. In FIG. 1, a memory cell array includes: normal memory cells (normal cells) MC arranged in rows and columns and dummy cells DM arranged in alignment with normal cells in the row direction. Word lines are provided corresponding to the respective rows of normal cells MC and dummy cells DM. In FIG. 1, there are shown six word lines WL0 to WL5 representatively.

Bit lines are provided corresponding to the columns of normal cells MC such that each bit line is shared by memory cells on adjacent columns. In FIG. 1, there are shown normal bit lines BL0 to BL7 representatively. A bit line BLs is placed adjacent to bit line BL7. Dummy bit lines DBL are provided corresponding to the columns of dummy cells DM. In FIG. 1, dummy cells DM are placed on two columns, and therefore three dummy bit lines DBL0 to DBL2 are shown.

Non-access memory cells SMC are placed in a region where normal cell MC and dummy cells DM are adjacent to each other in the row direction. Non-access memory cells SMC are connected to bit line BLs. Non-access memory cell SMC does not store effective data therein and no access is made thereto externally either. Non-access memory cells SMC are provided for maintaining regularity in layout pattern of arrangement of normal cells MC and dummy cells DM.

Dummy cell DM connected between bit lines DBL0 and DBL1, as described later, stores L level data in a charge accumulating region (right bit region) BTR while dummy cell DM connected between dummy bit lines DBL1 and DBL2 stores H level data in a charge accumulating region (left bit region) BTR. Here, it is assumed that a state where to store L level data corresponds to the erased state (low threshold voltage state) while a state where to store H level data corresponds to the programmed state (high threshold voltage state).

With non-access memory cell SMC provided, in a case where a bit line is shared between memory cells on adjacent rows and used as a virtual ground line as well, desired data can be stored in a dummy cell and a normal cell with correctness.

Furthermore, by arranging dummy cells DM and normal cells MC within the same array, dummy cells DM and normal cells MC can be the same in characteristics and further in interconnection line resistance and capacitance for currents supplied to the normal and dummy cells. An average current of the currents flowing through a normal cell can be generated to perform a correct comparison operation utilizing dummy cells.

There are provided row decode circuits XD0 to XD5 driving corresponding word lines WL0 to WL5 to a selected state according to an address signal not shown. A write voltage VWG and a read voltage VRG are selectively applied to power supply nodes of row decode circuits XD0 to XD5 through power supply transistors PG0 and PG1. Power supply transistors PG0 and PG1 are selectively driven to a conductive state according to a write instructing signal WRT and a read instructing signal RED.

Write voltage VWG includes an erase voltage applied onto a selected word line in erase operation and read voltage VRG includes a verify voltage for determining on whether or not data is correctly written/erased.

Bit lines BL0 to BL7 and BLs are provided with read column select gates G0 to G7 and Gs rendered selectively conductive according to read column select signals /RA0 to /RA7 and /RAs, respectively; and write column select gates WG0 to WG7 and WGs rendered selectively conductive according to write column select signals /WA0 to /WA7 and /WAs, respectively.

Read column select gates G0 to G7 and Gs are coupled to a complementary internal read data line pair VRD and write column select gates WG0 to WG7 and WGs are coupled to a complementary internal write data line pair VWD. Read column select gates G0 to G7 and Gs couple adjacent bit lines to different internal read data lines of complementary internal read data line pair VRD, and write column select gates WG0 to WG7 and WGs couple adjacent bit lines to different internal write data lines of complementary internal write data line pair VWD. This is because in memory cell selection, one bit line of a pair of adjacent bit lines is used as a data line and the other is used as a virtual source line, and a necessity arises for switching of the connection between bit lines of a pair.

Complementary internal write data line pair VWD is coupled to a write current switch 4 and complementary internal read data line pair VRD is coupled to a current sense amplification circuit 3. In write operation (program operation), a pair of adjacent bit lines are simultaneously selected and coupled to write current switch 4. Write current switch 4 sets voltages (ground voltage and program voltage) applied onto complementary internal read data line pair VWD according to which of right and left bits of a selected memory cell is programmed. Current sense amplification circuit 3 applies a read current/voltage onto one internal read data line of complementary internal read data line pair VRD and ground voltage onto the other according to which of right and left bits of a selected memory cell is subject to data read.

Dummy bit line DBL0 is coupled to dummy cell read current supply circuit 1 through a dummy read column select gate TO. A dummy write column select gate DW0 provided to dummy bit line DBL0 maintains a nonconductive state. In FIG. 1, dummy write column select gate DW0 is shown having a gate and a drain set in a floating state.

Here, as an erase method for a memory cell, such an erase operation is assumed that electrons accumulated in the nitride film of a memory cell are extracted through the control gate. In this erase method, memory cells connected to one word line are simultaneously erased.

Dummy cell DM placed between dummy bit lines DBL0 and DBL1 stores L level data in the right bit region BTR. Specifically, since dummy cell DM placed between dummy bit lines DBL0 and DBL1 maintains the erase state, it is not required to flow a current for programming and no problem arises even if dummy bit line DBL0 is put into the floating state in programming. Non-access memory cell SMC stores no data, and therefore, dummy bit line DBL0 is not needed to be set to a program voltage level in programming and accordingly. Thus, no problem arises even if dummy bit line DBL0 is maintained in the floating state.

Dummy bit line DBL1 is coupled to a ½ current generating circuit 2 through dummy read column select gate TT1 and further coupled to dummy write current generating circuit 5 through dummy write column select gate DW1.

Dummy bit line DBL2 is coupled to dummy cell read current supply circuit 1 through dummy read column select gate TT2 and further to ground voltage level through dummy write column select gate DW2.

Dummy read select signal /RAD is applied to the gates of the dummy read column select gates T0 to T2 and dummy write column select signal /WAD is applied to the gates of dummy write column select gates DW1 and DW2.

A dummy write current generating circuit 5 generates a program high voltage in programming of a dummy cell. In dummy cell programming, a program high voltage and a program current are supplied to dummy bit line DBL1 and dummy bit line DBL2 is set to ground voltage level. Therefore, in a case where a word line is driven to a program voltage level in dummy cell DM between dummy bit lines DBL1 and DBL2, a current flows from dummy bit line DBL1 to dummy bit line DBL2 to inject electrons into left bit region BTL of the memory cell and thus dummy cell DM enters programmed state.

Write current switch circuit 4 supplies a program high voltage/current to one data line of complementary internal write data line pair VWD and ground voltage to the other data line according to which of right bit and left bit of a selected normal cell is set to the programmed state.

Dummy cell read current supply circuit 1, in data reading, supplies a constant current of a prescribed magnitude. A current from dummy cell read current supply circuit 1 flows into dummy bit lines DBL0 and DBL2. A current flows from dummy bit lines DBL0 and DBL2 to dummy bit line DBL1 through dummy cell DM. Accordingly, the sum of a current flowing through a dummy cell storing H level data and a current flowing through a dummy cell storing L level data flows into dummy bit line DBL1.

½ current generating circuit 2 generates a current ½ times the sum of currents flowing through memory cells storing H level data and L level data to current sense amplification circuit 3. In data read mode of operation, current sense amplification circuit 3 compares a current flowing through a selected memory cell and appearing on internal read data line with a current from ½ current generating circuit 2, to generate internal read data RD according to a result of the comparison.

Current sense amplification circuit 3 performs current comparison and does not require charging and discharging of a capacitive element, which is required in voltage comparison, thereby enabling generation of internal read data RD at high speed.

Figure 2:
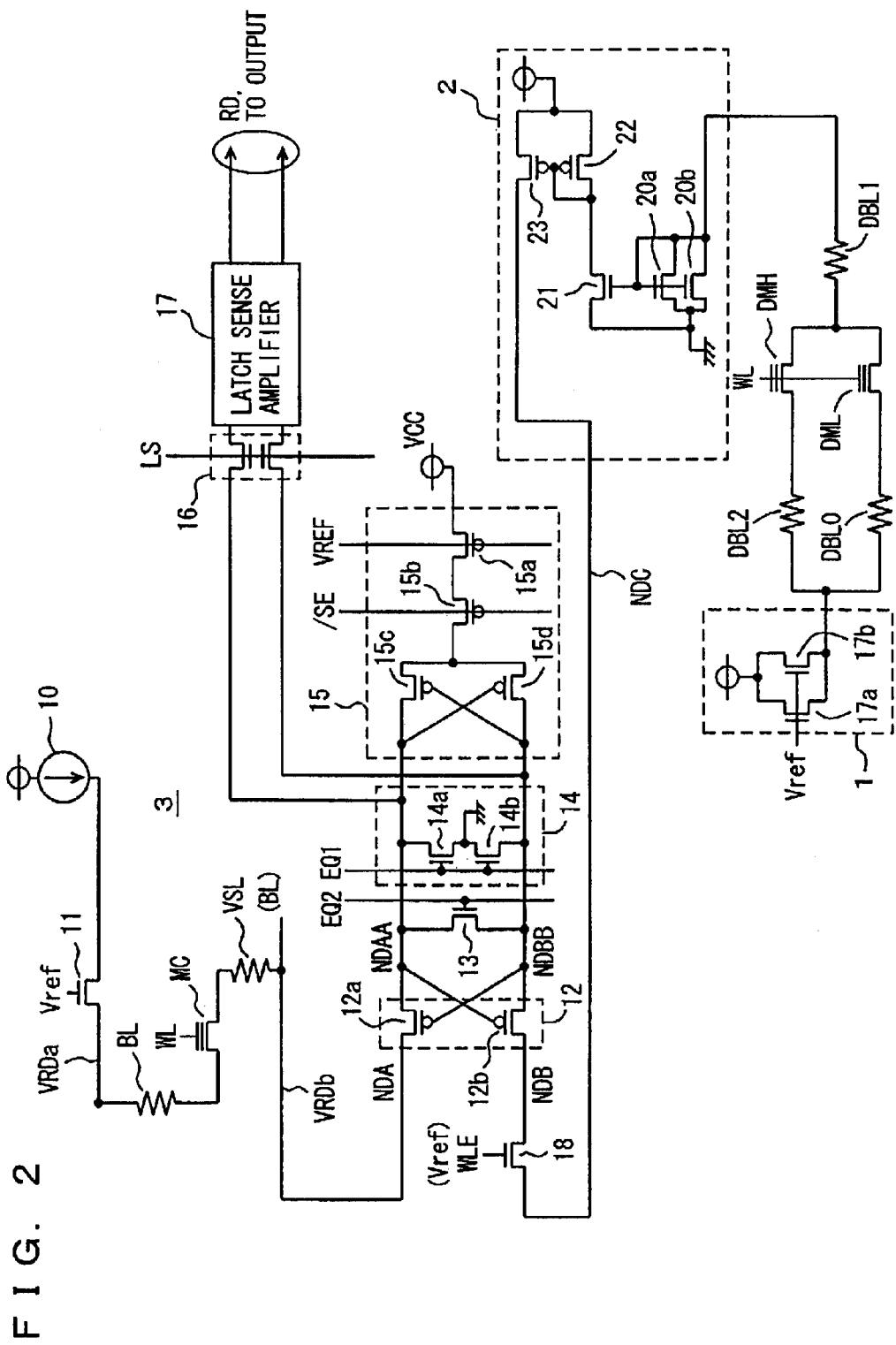
FIG. 2 is a diagram showing, in more detail, the configuration of a main part of a non-volatile semiconductor memory device shown in FIG. 1.

FIG. 2 is a diagram showing, in more detail, the configuration of a main part of a non-volatile semiconductor memory device shown in FIG. 1. In FIG. 2, dummy cell read current supply circuit 1 includes: N-channel MOS transistors 17a and 17b receiving a reference voltage Vref at the gates thereof to supply a current to dummy bit lines DBL1 and DBL2 through dummy read column select gates not shown. Dummy bit lines DBL0 and DBL2 are connected to dummy bit line DBL1 through dummy cells DML and DMH, respectively. Dummy cell DML stores L level data and dummy cell stores H level data. Data reading is performed along the reverse direction in data reading operation.

Reference voltage Vref is applied in order to limit voltage amplitudes of dummy bit lines DBL0 and DBL2. Reference voltage Vref is also utilized in current sense amplification circuit 3 supplying a current into a bit line to which normal cells are connected, in order to limit a voltage amplitude of a normal bit line.

½ current generating circuit 2 includes: N-channel MOS transistors 20a and 20b receiving a current supplied through dummy bit line DBL1; N-channel MOS transistor 21 constituting a current mirror circuit together with MOS transistors 20a and 20b; P-channel MOS transistor 22 supplying a current to MOS transistor 21; and P-channel MOS transistor 23 constituting a current mirror circuit together with MOS transistor 22 to supply a current to a node NDC. MOS transistors 20a, 20b and 21 are the same in size (a ratio of a channel width to a channel length) and therefore have the same current driving ability with each other.

MOS transistors 20a and 20b discharge a current supplied through dummy bit line DBL1 to ground node. The drains of MOS transistors 20a and 20b are coupled commonly to the gate of MOS transistor 21 and a current having a magnitude ½ times the sum of currents flowing in MOS transistors 20a and 20b flows through MOS transistor 21.

MOS transistor 21 is supplied with a current from MOS transistor 22, MOS transistors 22 and 23 have the same size with each other and a current ½ times in magnitude a current flowing through dummy bit line DBL1 is supplied to node NDC. Therefore, a current ½ times the sum of currents flowing through dummy cell DMH storing H level data and dummy cell DML storing L level data from ½ current generating circuit 2 flows into node NDC.

In ½ current generating circuit 2, MOS transistors 20a and 20b constitute a current mirror circuit with a mirror ratio of ½ together with MOS transistor 21. MOS transistors 20a and 20b may be replaced with one MOS transistor (with a doubled channel width). It is sufficient to construct a current mirror circuit with a mirror ratio of ½.

Current sense amplification circuit 3 includes: a constant current source 10 supplying a constant current; and an N-channel MOS transistor 11 supplying a current from constant current source 10 to internal read data line VRDa. Reference voltage Vref is supplied to the gate of MOS transistor 11. By applying reference voltage Vref to the gate of MOS transistor 11, a current supplied from internal read data line VRDa to selected bit line BL is limited to prevent a voltage level of selected bit line BL from rising.

Normal cell MC is connected between bit line BL and virtual source line VSL (bit line BL). Bit line BL is connected to internal read data line VRDa through a read column select gate not shown and virtual source line VSL is connected to internal read data line VRDb through a read column select gate not shown. Internal read data lines VRDa and VRDb constitute internal read data line pair VRD shown in FIG. 1.

Connections between bit line BL and virtual source line VSL and internal read data lines VRDa and VRDb is switched depending on which of right and left bits of a normal cell is to be read out. For example, the connection is established utilizing a right bit/left bit indicating signal generated using the least significant bit of a column address signal, the connection. In FIG. 2, for simplification of the figure, there is not shown a configuration of a multiplexer for switching the connection to internal read data lines VRDa and VRDb according to right bit/left bit indicating signal. For example, such a multiplexer can be implemented using two parallel connected MOS transistors and by applying a right/left bit indicating signal to such MOS transistors.

Current sense amplification circuit 3 further includes: a current amplification circuit 12 amplifying a current supplied through nodes NDA and NDB to drive internal nodes NDAA and NDBB according to a result of the amplification; an N-channel MOS transistor 13 equalizing internal nodes NDAA and NDBB according to an equalize instructing signal EQ2; a precharge circuit 14 precharging internal nodes NDAA and NDBB to ground voltage level according to an equalize instructing signal EQ1; and a differential amplification circuit 15 differentially amplifying potentials on internal nodes NDAA and NDBB according to a sense activation instructing signal /SE.

Current amplification circuit 12 includes: a P-channel MOS transistor 12a connected between nodes NDA and NDAA, and having a gate connected to internal node NDBB; and a P-channel MOS transistor 12b connected between nodes NDB and NDBB, and having a gate connected to node NDAA.

Precharge circuit 14 includes: N-channel MOS transistors 14a and 14b rendered conductive in activation of equalize instructing signal EQ1, to transmit ground voltage to internal nodes NDAA and NDBB.

Differential amplification circuit 15 includes: a P-channel MOS transistor 15a receiving reference voltage Vref at a gate thereof to supply a constant current from power supply node; a P-channel MOS transistor 15b rendered conductive in activation of sense activation instructing signal /SE, to transmit a current from MOS transistor 15a; a P-channel MOS transistor 15c connected between MOS transistor 15b and internal node NDAA, and having a gate connected to internal node NDBB; and a P-channel MOS transistor 15d connected between MOS transistor 15b and internal node NDBB, and having a gate connected to internal node NDAA.

Differential amplification circuit 15, when activated, raises a potential on the higher potential node out of internal nodes NDAA and NDBB to power supply voltage level. A potential level of the internal node with a low potential is driven by current amplification circuit 12.

MOS transistors 12a and 12b included in current amplification circuit 12 are low Vth transistors and the absolute values of threshold voltages thereof are made sufficiently smaller. Node NDB is connected to node NDC through N-channel MOS transistor 18 made conductive in response to a word line select enable signal WLE. An output signal of a row select circuit is activated in response to word line select enable signal WLE, and a voltage level on a selected word line is driven to a prescribed voltage level.

MOS transistor 18 is provided in order to allowing flowing of currents into nodes NDA and NDB at substantially the same timing. As shown in FIG. 1, however, in a case where dummy cells DMH and DML are placed in the same array with normal cells MC and dummy cells DMH and DML are selected in response to driving of a word line WL to a selected state to cause a current to flow, MOS transistor 18 may not to be provided.

Current sense amplification circuit 3 further includes: a isolation gate 16 isolating internal nodes NDAA and NDBB from latch sense amplifier 17 in response to a latch sense enable signal LS. Latch sense amplifier 17, a configuration of which will be described later, includes cross coupled P-channel MOS transistors and cross coupled N-channel MOS transistors. Latch sense amplifier 17 is activated when isolation gate 16 is rendered non-conductive, to perform a sense operation in a so-called "charge confinement scheme", to latch amplified signals for generating internal read data RD.

Figure 3:
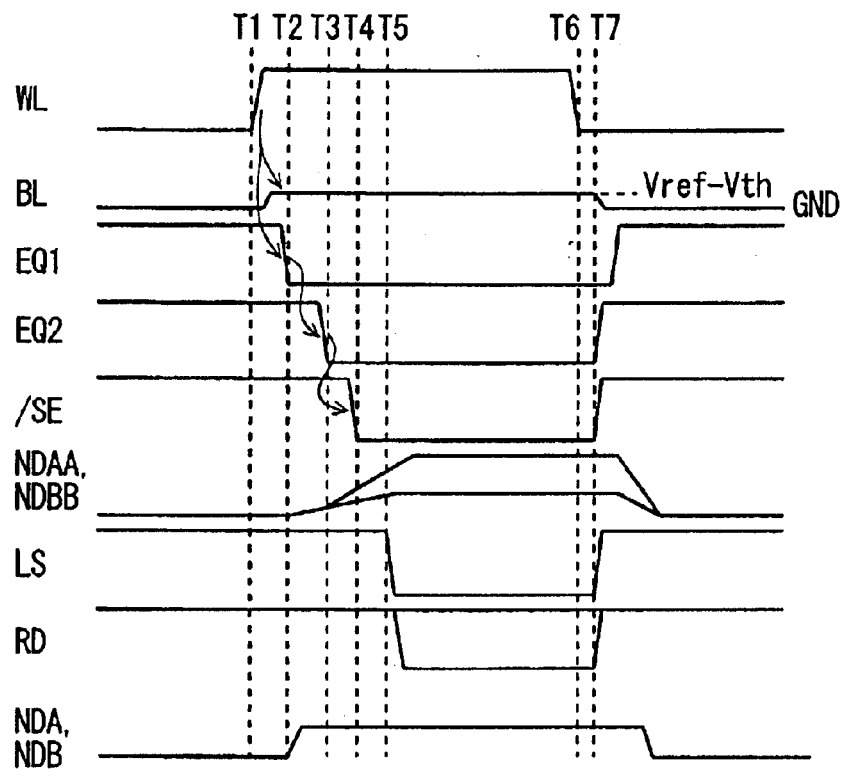
FIG. 3 is a timing diagram representing an operation in the non-volatile semiconductor memory device shown in FIG. 2.

FIG. 3 is a timing diagram showing operation in the non-volatile semiconductor memory device shown in FIG. 2. Referring to FIG. 3, description will be given of operation in the semiconductor memory device shown in FIG. 2 below.

In standby state, equalize instructing signals EQ1 and EQ2 are at H level and latch sense enable signal LS is also at H level. Internal nodes NDAA and NDBB are both at ground voltage level. Since nodes NDA and NDB are both at ground voltage level, MOS transistors 12a and 12b in current amplification circuit 12 are in non-conductive state.

At time T1, word line WL is selected and has a voltage level thereof raised. Bit line BL corresponding to a selected column is selected according to a column select signal and dummy bit lines DBL0 and DBL2 are also selected, and currents are supplied into bit lines BL, DBL0 and DBL2. Voltage levels on bit lines BL, DBL0 and DBL2 rise up to a level of reference voltage Vref–Vth according to the supply of currents. Here, Vth indicates a threshold voltage of transistor 11 receiving reference voltage Vref at a gate thereof. Still in this state, equalize instructing signals EQ1 and EQ2 are both at H level and MOS transistors 13, 14a and 14b are in conductive state, to maintain internal nodes NDAA and NDBB at ground voltage level.

When word line WL is driven to a selected state, a current flows from normal cell MC to internal read data line VRDb through virtual source line VSL according to stored data to raise a voltage level of node NDA. A current of the sum of currents flowing in dummy cells DMH and DML flows into virtual bit line DBL2.

In ½ current generating circuit 2, a current ½ times as large as the sum of currents flowing in MOS transistors 20a and 20b is generated by MOS transistors 21, 22 and 23 and supplied to node NDC. Since word line select enable signal WLE is in a selected state, a current from ½ current generating circuit 2 is supplied to node NDB, thereby raising a potential level of the node NDB. Since MOS transistors 12a and 12b are both in the conductive state and internal nodes NDAA and NDBB are maintained at ground voltage level, voltage levels of nodes NDA and NDB are maintained at the same level with each other though driving current amounts of MOS transistors 12a and 12b are different from each other.

At time T2, equalize instructing signal EQ1 attains L level to deactivate precharge circuit 14. On the other hand, equalize instructing signal EQ2 stays at H level to maintain equalizing MOS transistor 13 in a conductive state. Therefore, voltage levels of internal nodes NDAA and NDBB rise at the same speed with each other according to currents supplied from nodes NDA and NDB. On the other hand, nodes NDA and NDB have the supplying currents different from each other and a driving current of current amplification circuit 12 is shunted into internal nodes NDAA and NDBB.

While MOS transistors 12a and 12b have the same drain voltage through action of equalizing transistor 13, nodes NDA and NDB function as sources, and MOS transistors 12a and 12b are different in gate to source voltage supply different amounts of current. Still no voltage difference appears between nodes NDA and NDB according to stored data in normal cell MC. Voltage levels of nodes NDA and NDB rise according to supplied currents.

At time T3, equalize instructing signal EQ2 is set to L level to set equalizing MOS transistor 13 in a non-conductive state. Voltage levels of internal nodes NDAA and NDBB rise slightly and MOS transistors 12a and 12b of current amplification circuit 12 change the voltage levels at the internal nodes NDAA and NDBB according to currents supplied to nodes NDA and NDB.

For example, in a case where a current supplied to node DNA is smaller in amount than a current supplied to node NDB, a voltage level of internal node NDAA becomes lower than internal node NDBB, a conductance of MOS transistor 12b becomes larger than a conductance of MOS transistor 12a, a voltage level of internal node NDBB rises and in response, a conductance of MOS transistor 12a is lowered. By the feedback operation, driving currents of MOS transistors 12a and 12b changes according to the currents supplied to nodes NDA and NDB and a large voltage difference is caused between internal nodes NDAA and NDBB.

At time T4, sense activation instructing signal /SE is lowered to L level to activate differential amplification circuit 15. Responsively, the voltage level of the internal node at the higher voltage out of internal nodes NDAA and NDBB is driven to power supply voltage level by MOS transistors 15c and 15d. A driving current of sense amplification circuit 15 is determined by reference voltage Vref and by making a sense speed comparatively slow, a very small potential differential generated between internal nodes NDAA and NDBB can be differentially amplified stably with correctness.

The reason why equalize instructing signal EQ1 is deactivated when a prescribed time elapses after the activation of the equalize instructing signal is to raise voltage levels of internal nodes NDAA and NDBB to cause MOS transistors 12a and 12b of current amplification circuit 12 to set potential levels of internal nodes NDAA and NDBB correctly according to supplied currents. For example, when internal nodes NDAA and NDBB are both at ground voltage level, the voltage levels of internal nodes NDAA and NDBB might be set to an erroneous state by initial rushing currents if current amplification circuit 12 operates according to driving currents from node NDAA and NDBB.

When at time T5, a potential difference between internal nodes NDAA and NDBB is sufficiently developed, latch sense enable signal LS is driven to L level, and isolation gate 16 is driven into a non-conductive state to isolate latch sense amplifier 17 from internal nodes NDAA ad NDBB. In response to fall of latch sense enable signal LS, latch sense amplifier 17 is again activated to perform sensing, amplifying and latching operations according to voltage levels of the internal nodes charged by electric charges supplied from internal nodes NDAA and NDBB, to generate internal read data RD.

Currents are supplied to internal node NDA and NDB during a period when internal read data is generated as well. The upper limit of a voltage level of node NDA is determined by reference voltage Vref. On the other hand, a voltage level of node NDB is raised according to a current from ½ current generating circuit 2. Accordingly, reference voltage Vref may be applied to the gate of MOS transistor 18, instead of word line enable signal WELE. Alternatively, an N-channel MOS transistor receiving reference voltage Vref at a gate thereof may be provided in series with MOS transistor 23 in ½ current generating circuit 2.

Even if the voltage levels of nodes NDA and NDB rise to a level higher than the voltage levels of the internal nodes, MOS transistors 12a and 12b in current amplification circuit 12 turn non-conductive, to prevent an adverse influence from being exerted on the voltage levels of internal nodes NDAA and NDBB.

When a selected normal cell is in an erase state and drives a current larger than a current supplied by ½ current generating circuit 2, a following case may be considered. If a sensing period is longer, a voltage level of node NDB is raised higher than that of node NDA by a supply current from ½ current generating circuit 2 since the upper limit of a voltage level of node NDA is determined by reference voltage Vref. In such a case, however, internal node NDAA is driven to power supply voltage level to cause MOS transistor 12b to be non-conducive. Therefore, such inversion of the voltage levels has no adverse influence on the voltage levels of internal nodes NDAA and NDBB, and internal read data RD corresponding to the difference between driving currents can be generated correctly according to latch sense enable signal LS.

Internal read data RD is comprised of complementary data at power supply voltage level and ground voltage level, and buffered by an output circuit not shown to generate external read data.

When the series of these operations is completed, latch sense amplifier 17 is deactivated and a selected word line is driven to non-selected state. Accordingly, internal nodes NDAA and NDBB are driven to ground voltage level by precharge circuit 14 and equalizing MOS transistor 13, and nodes NDA and NDB are initialized to ground voltage level through current amplification circuit 12.

When a column select signal is deactivated, internal read data lines VRDa and VRDb are isolated from bit line BL and virtual source line VSL. Dummy bit line DBL1 is isolated from dummy cells DMH and DML by a read column select gate not shown and no current flows through dummy bit line DBL1, and therefore, a supply current from ½ current generating circuit 2 to node NDC is cut off.

Figure 4:
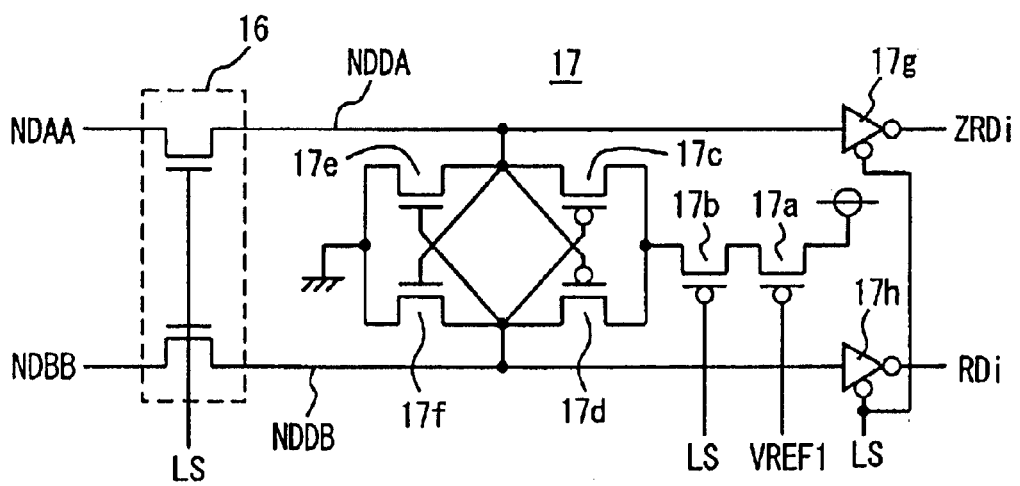
FIG. 4 is a diagram showing an example of a configuration of latch sense amplifier shown in FIG. 2.

FIG. 4 is a diagram showing an example of the configuration of latch sense amplifier 17 shown in FIG. 2. In FIG. 4, latch sense amplifier 17 includes: a P-channel MOS transistor 17a coupled to power supply node and receiving reference voltage VREF1 at a gate thereof; a P-channel MOS transistor 17b connected in series to MOS transistor 17a, and receiving a complementary latch sense enable signal /LS at a gate thereof; P-channel MOS transistors 17c and 17d having gates and drains cross coupled; N-channel MOS transistors 17e and 17f having gates and drains cross coupled; and tri-state inverter buffers 17g and 17h activated when a complementary latch sense enable signal /LS is at L level, to invert voltage levels of internal node NDDA and NDDB and to generate internal read data bits ZRDi and RDi.

MOS transistors 17c and 17e have respective drains connected to node NDDA and respective gates connected to node NDDB. MOS transistors 17f and 17d are connected to node NDDA at the respective gates and connected to node NDDB at respective drains.

In the configuration of the latch sense amplifier 17 shown in FIG. 4, when latch enable signal LS is at H level, isolation gate 16 is in conductive state and nodes NDDA and NDDB are electrically connected to internal nodes NDAA and NDBB, respectively. Accordingly, internal nodes NDDA and NDDB are precharged to ground voltage level. When latch sense enable signal LS is at H level, MOS transistor 17b is in a non-conductive state and tri-state inverter buffers 17g and 17h are in a non-conductive state. Internal read data bits ZRDi and RDi are maintained at power supply voltage level by a pull-up resistance or a precharge circuit, both not shown.

When latch sense enable signal LS attains L level, isolation gate 16 turns non-conductive to confine charges transmitted from nodes NDAA and NDBB in nodes NDDA and NDDB. When latch sense enable signal LS attains L level, MOS transistor 17b turns conductive to activate a sense amplifier constituted of MOS transistors 17c to 17f, which in turn differentially amplifies and latches the voltage levels of internal nodes NDDA and NDDB.

When latch sense enable signal LS attains L level, tri-state inverter buffers 17g and 17h are activated to generate internal read data bits ZRDi and RDi according to voltage levels of internal nodes NDDA and NDDB.

When a read cycle for internal read data is completed, latch sense enable signal LS attains H level, MOS transistor 17b turns non-conductive to deactivate tri-state inverter buffers 17g and 17h. Internal nodes NDDA and NDDB are precharged to ground voltage level by equalizing MOS transistor 13 and precharge circuit 14 shown in FIG. 2 through internal nodes NDAA and NDBB.

In latch sense amplifier 17, an operating current is determined by reference voltage VREF1 and latch sense amplifier 17 performs a sense operation at a higher speed than differential amplification circuit 15, to generate internal read data.

According to the first embodiment of the present invention, as described above, a current having a magnitude of the average of currents flowing through memory cells in erased state and in programmed state is generated, the average current is compared with a current flowing in a selected normal cell. Thus, internal read data is generated following a current sensing scheme, and internal read data can be generated at high speed.

An average current is generated using a current mirror circuit, and a current of the average of a current flowing in a memory cell in erased state and a current flowing through a memory cell in programmed state can be generated correctly.

By arranging dummy cells and normal cells in the same array, characteristics of a dummy cell can be made the same as those of a normal cell and a correct average current can be generated. Conditions such as an interconnection capacitance for a current flowing in a normal cell can be easily made the same as those for a current flowing in a dummy cell. Internal read data can be correctly generated through comparison in magnitude of a read current of a normal cell with the average current.

[Second Embodiment]

Figure 5:
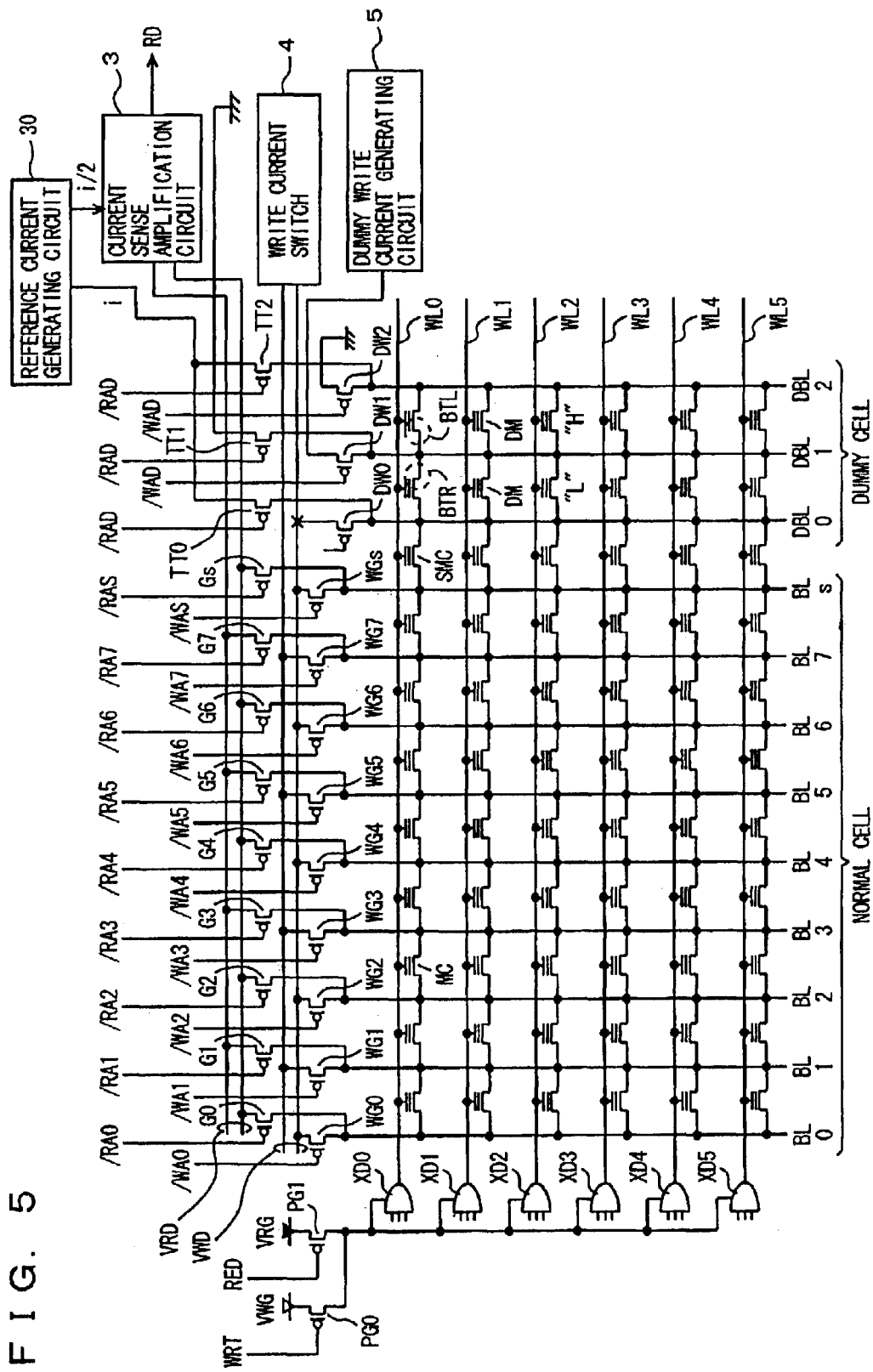
FIG. 5 is a diagram schematically showing a configuration of a main part of a non-volatile semiconductor memory device according to a second embodiment of the present invention.

FIG. 5 is a diagram schematically showing a configuration of a main part of a non-volatile semiconductor memory device according to a second embodiment of the present invention. A configuration shown in FIG. 5 is different from the configuration shown in FIG. 1 in the following points. That is, there is provided a reference current generating circuit 30 that in data reading, supplies dummy read current, i, into dummy bit lines DBL0 and DBL2 and generates the average current i/2 to transmit the average current to current amplification circuit 3. Dummy bit line DBL1, in data reading, is coupled to ground node through a read select gate TT1. The other parts of the configuration are the same as corresponding parts of the configuration shown in FIG. 1, and corresponding parts are attached with the same reference numerals and detailed descriptions thereof will not repeated.

In the configuration shown in FIG. 5, in data reading, dummy bit line DBL1 is coupled to ground node. Reference current generating circuit 30 supplies dummy read current i to dummy cell (DMH) storing H level data and dummy cell (DML) storing L level data. Therefore, dummy read current i from reference current generating circuit 30 is the sum of a current flowing through a memory cell storing H level data and a current flowing through a memory cell storing L level data. Reference current generating circuit 30 generates a current i/2, which is the average value of dummy read current i, to supply the average current to current sense amplification circuit 3. In data reading, current sense amplification circuit 3, compares a current flowing in internal read data line VRD with an average current i/2 from reference current generating circuit 30 to generate internal read data RD according to a result of the comparison.

Figure 6:
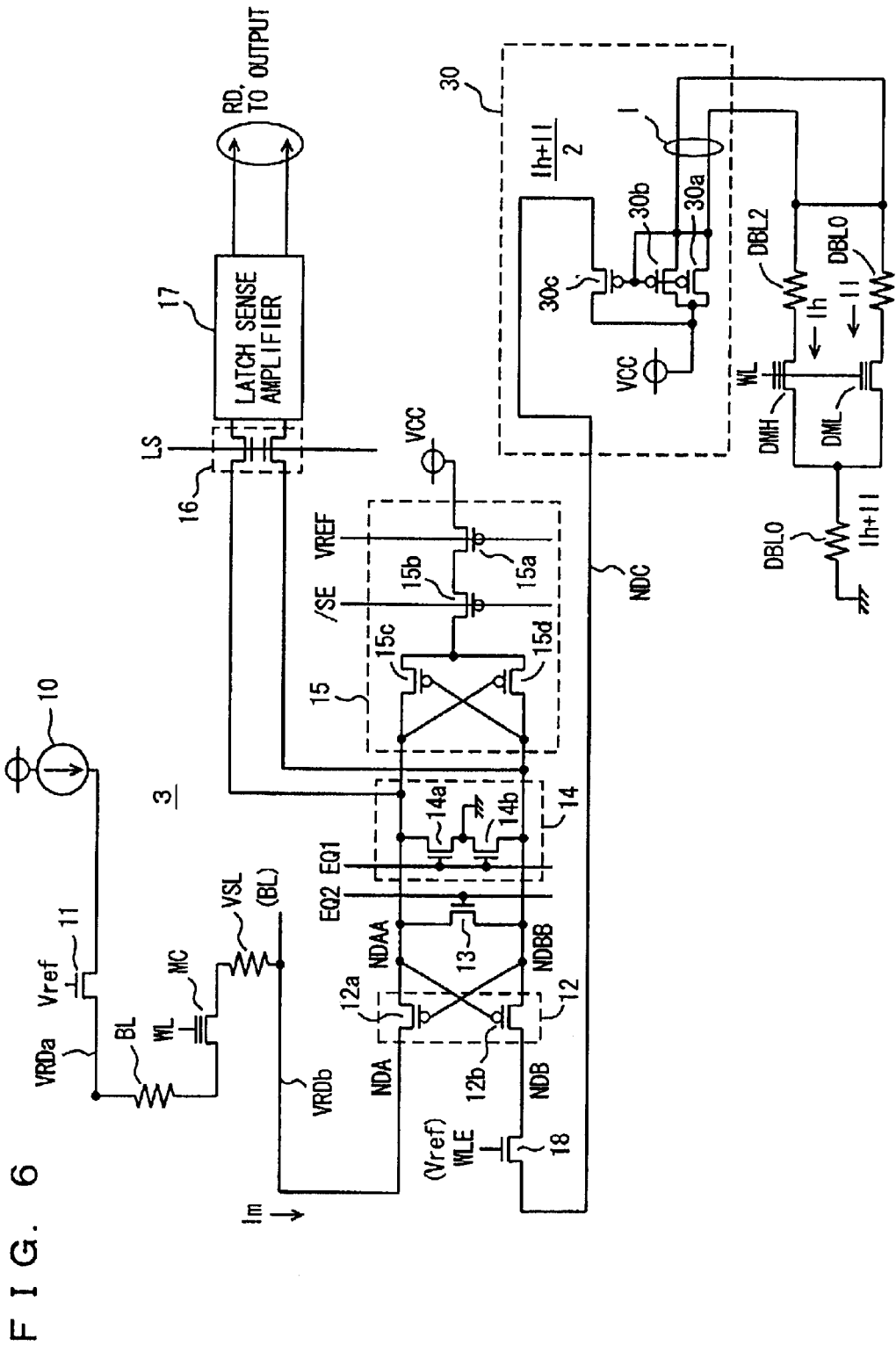
FIG. 6 is a diagram showing more of details of the configuration of a main part of a non-volatile semiconductor memory device shown in FIG. 5.

FIG. 6 is a diagram showing, in more detail, the configuration of a main part of a non-volatile semiconductor memory device shown in FIG. 5. In a configuration shown in FIG. 6, reference current generating circuit 30 supplies dummy read current I (=i) to dummy cells DM1 and DML and supplies a mirror current with a mirror ratio of ½ of dummy read current I to current sense amplification circuit 3 through node NDC. Dummy cells DMH and DML are coupled to ground node through dummy bit line DBL0 (in data reading). Accordingly, dummy read current I is given by the following relation with currents flowing through dummy cells DMH and DML being Ih and Il, respectively: I=Ih+Il.

Reference current generating circuit 30 includes: P-channel MOS transistors 30a and 30b, having their respective gates and their respective drains commonly connected, each supplying a current from a power supply node; and P-channel MOS transistor 30c constituting a current mirror circuit with MOS transistors 30a and 30b.

MOS transistors 30a to 30c has the same size and MOS transistor 30c supplies a current with a mirror ratio of ½, that is, a current I/2=(Ih+Il)/2, to node NDC.

Reference current generating circuit 30 may be constituted of MOS transistors with different sizes. It is sufficient to generate a mirror current with a mirror ratio of ½ of a dummy read current I.

A current I from reference current generating circuit 30 is supplied into dummy bit lines DBL0 and DBL2. Dummy cell DMH storing H level data is connected to dummy bit line DLB2, and dummy cell DML storing L level data is connected to dummy bit line DLB0. Therefore, current Ih flows into dummy bit line DBL2 and current Il flows into dummy bit line DBL0 according to stored data.

Normal cell MC supplies a memory cell current Im into internal read data line VRDb through virtual source line VSL (bit line BL) according to stored data. Current sense amplification circuit 3 compares, in magnitude, memory cell current Im with a mirror current (average current) (Ih+Il)/2 from reference current generating circuit 30 to generate internal read data RD according to a result of the comparison. The configuration of current sense amplification circuit 3 is the same as the configuration shown in FIG. 2, and the same reference numerals are attached to corresponding constituents and detailed descriptions thereof will not be repeated.

In the configuration shown in FIG. 6, reference current generating circuit 30 supplies currents Ih and Il flowing through respective dummy cells DMH and DML and generates a mirror current of the currents. In the configuration shown in FIG. 2, there is generated a mirror current of the current, Ih+Il, flowing into dummy bit line DBL0 through dummy cells DMH and DML. Accordingly, in the configurations shown in FIGS. 2 and 6, a difference resides in whether to use a current on the supplying side of a dummy read current or to use a current flowing out from a dummy cell. In the configuration shown in FIG. 6 as well, a current with a magnitude of the average of currents flowing through dummy cells DMH and DML is generated and supplied to current sense amplification circuit 3. Accordingly, an internal data read operation in current sense amplification circuit 3 is the same as in the configuration shown in FIGS. 1 and 2 and there are performed operations similar to the operations represented in the operating waveforms shown in FIG. 3, to perform reading of internal data.

In the configuration shown in FIGS. 5 and 6 as well, memory cell current Im flowing through memory cell MC is larger or smaller in magnitude than reference current (average current) (Ih+Il)/2 from reference current generating circuit 30 and internal read data is generated according to a magnitude of the current. Thus, according to a current sensing scheme, internal read data can be generated at high speed.

Therefore, in the second embodiment of the present invention as well, an effect similar to that of the first embodiment can be provided.

[Third Embodiment]

Figure 7:
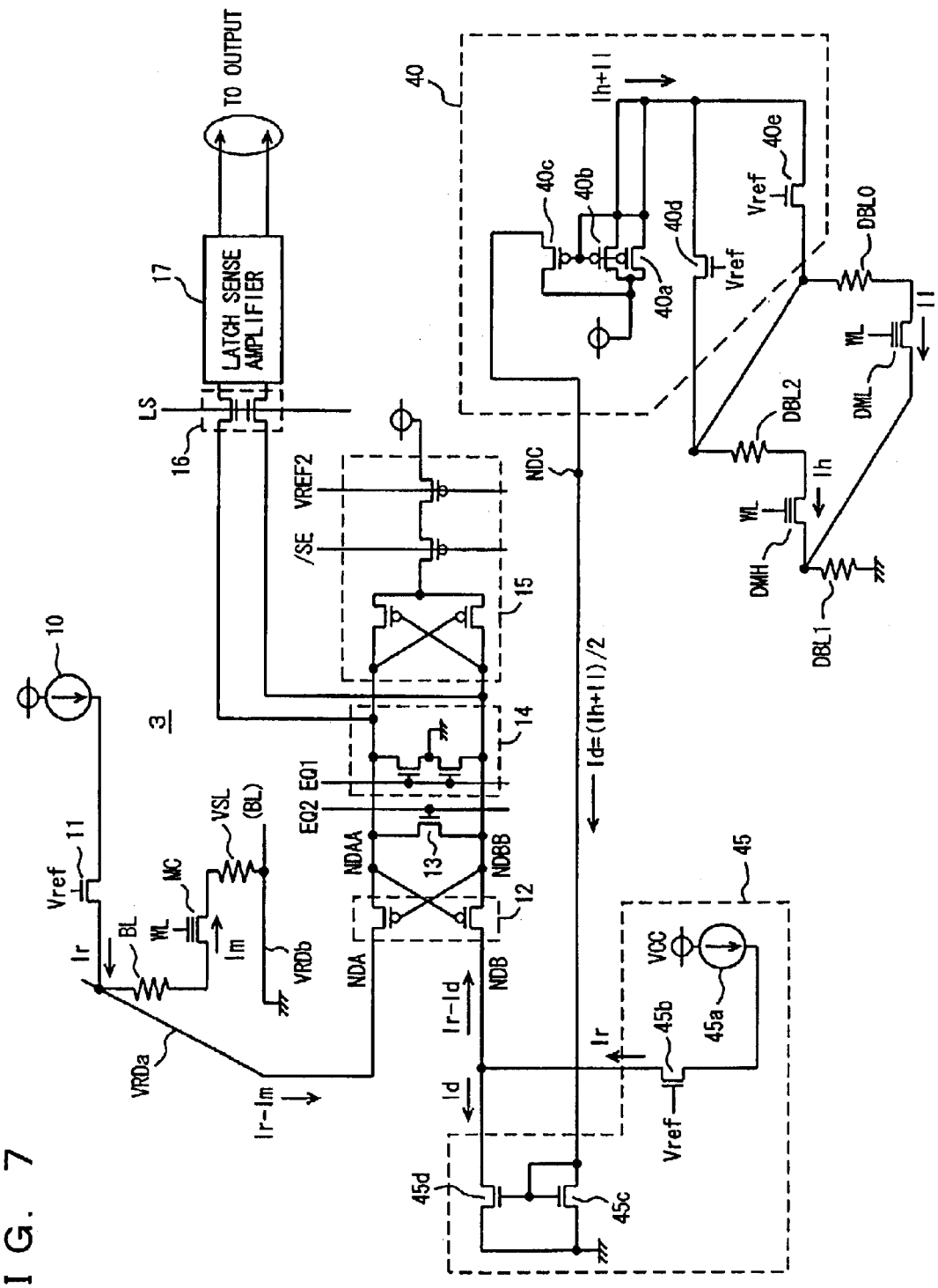
FIG. 7 is a diagram schematically showing a configuration of a main part of a non-volatile semiconductor memory device according to a third embodiment of the present invention.

FIG. 7 is a diagram showing a configuration of a main part of a non-volatile semiconductor memory device according to a third embodiment of the present invention. In FIG. 7, current sense amplification circuit 3 has a configuration similar to that in the first and second embodiments. However, dissimilarly to the first and second embodiments, current sense amplification circuit 3 compares a current flowing through internal read data line VRDa with a current supplied from a subtraction circuit 45. That is, in the configuration shown in FIG. 7, current sense amplification circuit 3 utilizes a reference current subtracted by a current flowing in a memory cell as a comparison object.

In the third embodiment as well, dummy cells DM and normal cells MC are arranged in alignment with each other in the same array. A configuration of the memory array in the third embodiment is the same as that of the memory cell array shown in each of FIG. 1 or 5.

Internal read data lines VRDa and VRDb are connected to bit line BL and virtual source line VSL, respectively. Connection between internal read data lines VRDa and VRDb, and bit line BL and virtual source lines VSL is switched according to which data of right and left bits is read. Current sense amplification circuit 3 has the same configuration as in each of the first and second embodiments, and corresponding components are denoted by the same reference numerals and detailed descriptions thereof will not be repeated.

In order to use a current (hereinafter referred to as residual current) Ir–Im, as a comparison object, of the subtraction of current Im flowing in memory cell MC from a cell read current Ir supplied from power supply 10 and MOS transistor 11, there are provided a current generating circuit 40 generating the average current of currents flowing in dummy cells DMH and DML and a subtraction circuit 45 generating a difference current between average current Id generated by current generating circuit 40 and reference current Ir to supply the difference current to current sense amplification circuit 3.

In the third embodiment as well, there are provided dummy cell DMH storing H level data and dummy cell DML storing L level data. Dummy cell DMH, when selected, causes a current Ih to flow into dummy bit line DBL1 and dummy cell DML, when selected, causes a current Il to flow into dummy bit line DBL1.

Current generating circuit 40 includes: P-channel MOS transistors 40a and 40b connected to power supply node, and their respective gates and their respective drains connected together; a P-channel MOS transistor 40c constituting a current mirror circuit with P-channel MOS transistors 40a and 40b; an N-channel MOS transistor 40d receiving currents from MOS transistors 40a and 40b and further receiving reference voltage Vref at a gate thereof; and an N-channel MOS transistor 40e receiving currents from MOS transistors 40a and 40b and further receiving reference voltage Vref at a gate thereof.

Currents from MOS transistors 40d and 40e are supplied to dummy cells DMH and DML through dummy bit lines DBL2 and DML0. In FIG. 7, dummy bit lines DBL0 and DBL2 are shown being commonly connected when selected. Currents may be supplied into dummy bit lines DBL0 and DBL2 separately from MOS transistors 40d and 40e when selected. MOS transistors 40d and 40e prevent the voltage levels of dummy bit lines DBL0 and DBL2 from rising beyond a voltage of Vref–Vth, according to Vref. Thereby, a correct dummy current of a current flowing in a normal cell can be generated. Here, Vth indicates a threshold voltage of MOS transistors 40d and 40e.

In current generating circuit 40, MOS transistors 40a to 40c have the same size, and a current of a magnitude ½ times as large as that of currents supplied by MOS transistors 40a and 40b flows into MOS transistor 40c. Currents Ih and Il flowing in dummy cells DMH and DML are supplied through MOS transistors 40d and 40e, respectively. MOS transistors 40a to 40c constitute a current mirror circuit with a current mirror ratio of ½. Therefore, an average current Id=(Ih+Il)/2 is supplied through MOS transistor 40c to node NDC from current generating circuit 40.

Subtraction circuit 45 includes: a constant current source 45a supplying a constant current; an N-channel MOS transistor 45b receiving reference voltage Vref at a gate thereof to transmit a constant current from constant current source 45a to node NDB as a reference current Ir; an N-channel MOS transistor 45c connected between node NDC and ground node, and having a gate connected to node NDC; and an N-channel MOS transistor 45d connected between node NDB and ground node, and having a gate connected to node NDC.

Current source 45a and MOS transistor 45b is of the same configuration as current source 10 and MOS transistor 11, and supply current Ir of the same magnitude.

MOS transistors 45c and 45d are of the same size and constitute a current mirror circuit with a mirror ratio of 1.

In subtraction circuit 45, current Ir of the same magnitude as current Ir supplied by MOS transistor 11 through MOS transistor 45b is supplied to node NDB. MOS transistor 45d discharges average current Id supplied from current generating circuit 40 through node NDC to ground node out of current Ir. Therefore, current Ir−Id flows into node NDB. Current sense amplification circuit 3, therefore, compares current Ir−Im from internal read data line VRDa with current Ir−Id supplied from subtraction circuit 45 to node NDB, to generate internal read data according to a result of the comparison.

In the case shown in FIG. 7, when a selected normal cell MC is in the erase state and memory cell current Im is larger than average current Id, current Ir−Im is smaller than current Ir−Id. To the contrary, when a read bit of the selected normal cell MC is in the programmed state, memory cell current Im is smaller than average current Id. Accordingly, in this case, current Ir−Im is larger than current Ir−Id. The current difference is amplified by current sense amplification circuit 3.

Figure 8:
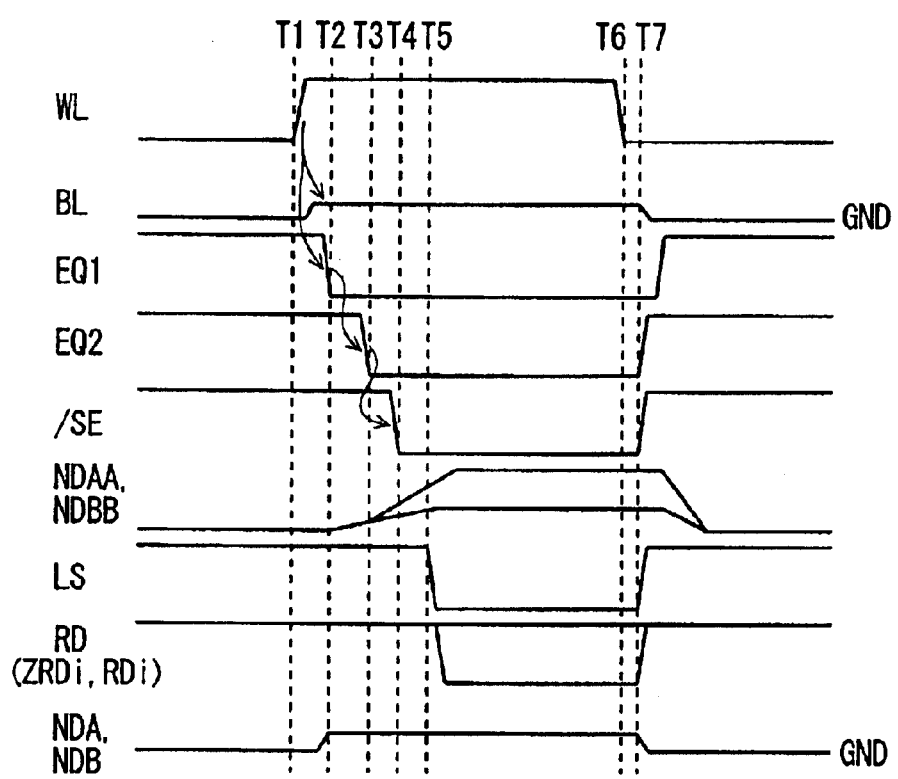
FIG. 8 is a timing diagram showing operation in the non-volatile semiconductor memory device shown in FIG. 7.

FIG. 8 is an operation timing diagram for operation in the circuit shown in FIG. 7. The operating waveforms in the operation timing diagram shown in FIG. 8 are substantially the same as those of the operation waveform diagram shown in FIG. 3. At time T1, word line WL is selected and a read column select gate is similarly selected to supply a current into bit line BL and to cause a bit line voltage level to reach a voltage level determined by reference voltage Vref.

The residual current of a current flowing in normal cell MC flows to node DNA to raise a voltage level of the node DNA. Since dummy cells DMH and DML are simultaneously selected, average current Id is generated by current generating circuit 40, current Ir−Id is supplied to node NDB to raise a voltage level of node NDB. At this time, in current sense amplification circuit 3, precharge/equalize operations are performed on internal nodes NDAA and NDBB, and nodes NDA and NDB are at the same voltage level (set to a voltage level according to the absolute value of a threshold voltage of MOS transistors of current amplification circuit 12).

Then, similarly to the first and second embodiments, at time T2, equalize instructing signal EQ1 attains an inactive state, a precharge operation on internal nodes NDAA and NDBB is completed, and voltage levels of internal nodes NDAA and NDBB rise according to currents supplied from node NDA and NDB.

Since equalize transistor 13 is in conductive state, voltage levels of internal nodes NDAA and NDBB are at the same level with each other, driving currents of MOS transistors 12a and 12b are different from each other and nodes NDA and NDB maintain the same level as each other.

At time T3, equalize instructing signal EQ2 are deactivated to complete an equalize operation on internal nodes NDAA and NDBB. Even when voltage levels of nodes NDA and NDB are at the same level with each other, the amounts of supplying currents to nodes NDA and NDB are different from each other, the amounts of currents supplied to internal nodes NDAA and NDBB through current amplification circuit 12 are different from each other to produce a voltage difference between internal nodes NDAA and NDBB. A current amplification operation of current amplification circuit 12 is the same as the operation of current amplification circuit 12 shown in FIG. 2 described with reference to the waveform diagram shown in FIG. 3.

At time T4, sense activation instructing signal /SE is activated and the voltages on internal nodes NDAA and NDBB are differentially amplified. Then, at time T5, latch sense enable signal LS is set to L level to allow the latch sense amplifier 17 to perform a sense operation according to the electron confinement scheme. Accordingly, internal read data RD (ZRDi and RDi) is generated.

When reading of memory cell data is completed, at time T6, word line WL is driven to a non-selected state. Subsequently at time T7, equalize instructing signal EQ2 and latch sense enable signal LS are driven to H level of active state and equalize instructing signal EQ1 is then driven to H level to precharge internal nodes NDAA and NDBB again to ground voltage level. Nodes NDA and NDB are again driven to ground voltage level as well.

Therefore, in the configuration shown in FIG. 7 as well, data reading is performed according to the current sense scheme, enabling generation of internal read data at high speed.

Note that in a case where a residual current is used, changes of the potential levels of internal nodes NDAA and NDBB in current sense amplification circuit 3 can be set to appropriate values by setting a magnitude of read current Ir to an appropriate value, which enables internal read data to be generated at high speed.

According to the third embodiment of the present invention, as described above, dummy cells storing H level data and L level data, respectively are used to generate the average current of currents flowing in the dummy cells and reading of internal data is performed using a residual current of a read current. Thus, internal read data can be generated at high speed according to the current sense scheme in a similar manner to the first and second embodiments. Furthermore, an effect similar to those in the first and second embodiments can be provided.

In a case where a residual current is used, setting a magnitude of the constant current Ir to an appropriate value can set a magnitude of a current supplied to current sense amplification circuit 3 to an optimal value to operate sense amplification circuit 3 a an optimal operating point.

[Fourth Embodiment]

Figure 9:
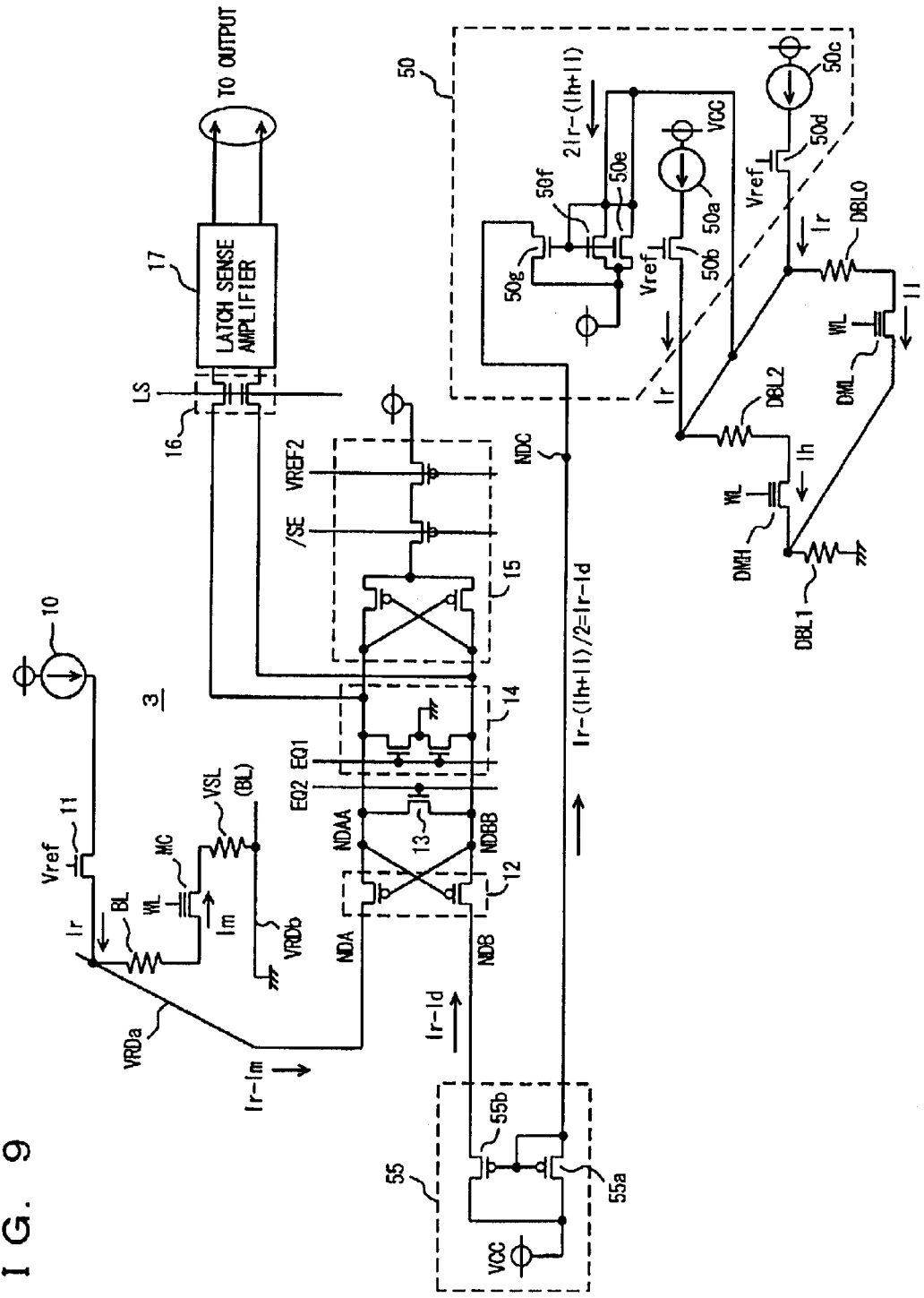
FIG. 9 is a diagram showing a configuration of a main part of a non-volatile semiconductor memory device according to a fourth embodiment of the present invention.

FIG. 9 is a diagram showing a configuration of a main part of a non-volatile semiconductor memory device according to a fourth embodiment of the present invention. In the fourth embodiment as well, dummy cells and normal cells are arranged in rows and columns in the same array. In a configuration according to the fourth embodiment shown in FIG. 9 as well, a residual current is used as a comparison object.

In order to generate a comparison reference current for a residual current of a memory cell current, there are provided: a current generating circuit 50 for supplying read currents to dummy cells DMH and DML to generate a residual current of the average current (Ih+Il)/2 of currents Ih and Il flowing in dummy cells DM1 and DML; and a current supply circuit 55 for generating a mirror current of a current from current generating circuit 50 to apply the mirror current to current sense amplification circuit 3.

Current generating circuit 50 supplies read currents to dummy cells DMH and DML to discharge a residual current of dummy cell currents to ground node.

Current generating circuit 50 includes: a constant current source 50a for generating a constant current; an N-channel MOS transistor 50b receiving reference voltage Vref at a gate thereof to supply a constant current from constant current source 50a; a constant current source 50c supplying a current the same in magnitude as constant current source 50a; and an N-channel MOS transistor 50d receiving reference voltage Vref at a gate thereof to supply a current from constant current source 50c.

Each of currents from MOS transistors 50b to 50d has the same magnitude as that of a current Ir supplied through MOS transistor 11 provided to normal cell MC. Currents from MOS transistors 50b and 50d are supplied to respective dummy cells DMH and DML through dummy bit lines DBL2 and DBL0. Currents Ih and Il flow to ground node through dummy bit line DBL1 according to stored data in dummy cells DMH and DML. Dummy cells DMH ad DML store H level data and L level data, respectively, in a reverse direction read configuration.

Current generating circuit 50 further includes: N-channel MOS transistors 50f and 50e discharging a remaining residual current of the subtraction of dummy read currents supplied to respective dummy cells DMH and DML from currents supplied from MOS transistors 50b and 50d; and an N-channel MOS transistor 50g constituting a current mirror circuit together with MOS transistors 50f and 50e.

MOS transistors 50e and 50f their respective gates and drains commonly connected together and constitute the master stage of the current mirror circuit. MOS transistor 50g has a gate connected to the gates of MOS transistors 50e and 50f and constitutes the slave stage of the current mirror circuit. MOS transistors 50e to 50g are the same in size and in current drive ability with each other. Therefore, a current with a mirror ratio of ½ of currents flowing in MOS transistors 50e and 50f is supplied from MOS transistor 50g to node NDC.

In current generating circuit 50 as well, a current mirror circuit may use MOS transistors with different sizes as components as far as a current of a mirror ratio of ½ can be generated.

In the configuration of current generating circuit 50, when currents Ih and Il flow in dummy cells DMH and DML, dummy residual current 2×Ir−(Ih+Il) flows into MOS transistors 50e and 50f. MOS transistor 50g generates a mirror current of the dummy residual current at a mirror ratio of ½. Therefore, MSO transistor 50g discharge a current Ir−(Ih+Il)/2.

Current supply circuit 55 supplies a current driven by MOS transistor 50g of current generating circuit 50. That is, current supply circuit 55 includes: a P-channel MOS transistor 55a connected between power supply node and node NDC, and having a gate connected to node NDC; and a P-channel MOS transistor 55b connected between power supply node and node NDB, and having a gate connected to node NDC. MOS transistors 55a and 55b are the same in size with each other and supply currents of the same magnitude. Current supply circuit 50 constitutes a current mirror circuit and supplies a mirror current of a current flowing through node NDC at a mirror ratio of 1 to node NDB. Therefore, a difference current Ir−Id between the average current Id=(Ih+Il)/2 of currents flowing in dummy cells DM1 and DML and reference current Ir is supplied from current supply circuit 55 to node NDB.

Current sense amplification circuit 3 has a configuration similar to those of the first to third embodiments and compares residual current Ir−Im of a normal cell with residual current Ir−Id of dummy cells. Therefore, the operating waveforms for the configuration shown in FIG. 9 is the same as those shown in FIG. 8, and internal read data can be generated at high speed according to the current sense scheme.

MOS transistors 50b and 50d, in standby state, have the source node potential raised and maintains off state, since a dummy select signal is set in a non-conductive state and MOS transistors 50b and 50d are disconnected from dummy bit lines DBL0 and DBL2. Therefore, no current flows in MOS transistors 50e and 50f and MOS transistor 50g maintains a non-conductive state. Node NDC, in standby state, is precharged to power supply voltage VCC level by MOS transistor 55a and in response, MOS transistors 55a and 55b maintains off state. Therefore, even though internal nodes NDAA and NDBB are precharged and equalized to ground voltage level by equalizing transistor 13 and precharge circuit 40, nodes NDA and NDB are maintained at ground voltage level.

Note that connections of internal read data lines VRDa and VRDb to bit line BL and virtual source line VSL are determined according to a right bit/left bit read instructing signal (for example, generated from the least significant bit of a column address).

[Fifth Embodiment]

Figure 10:
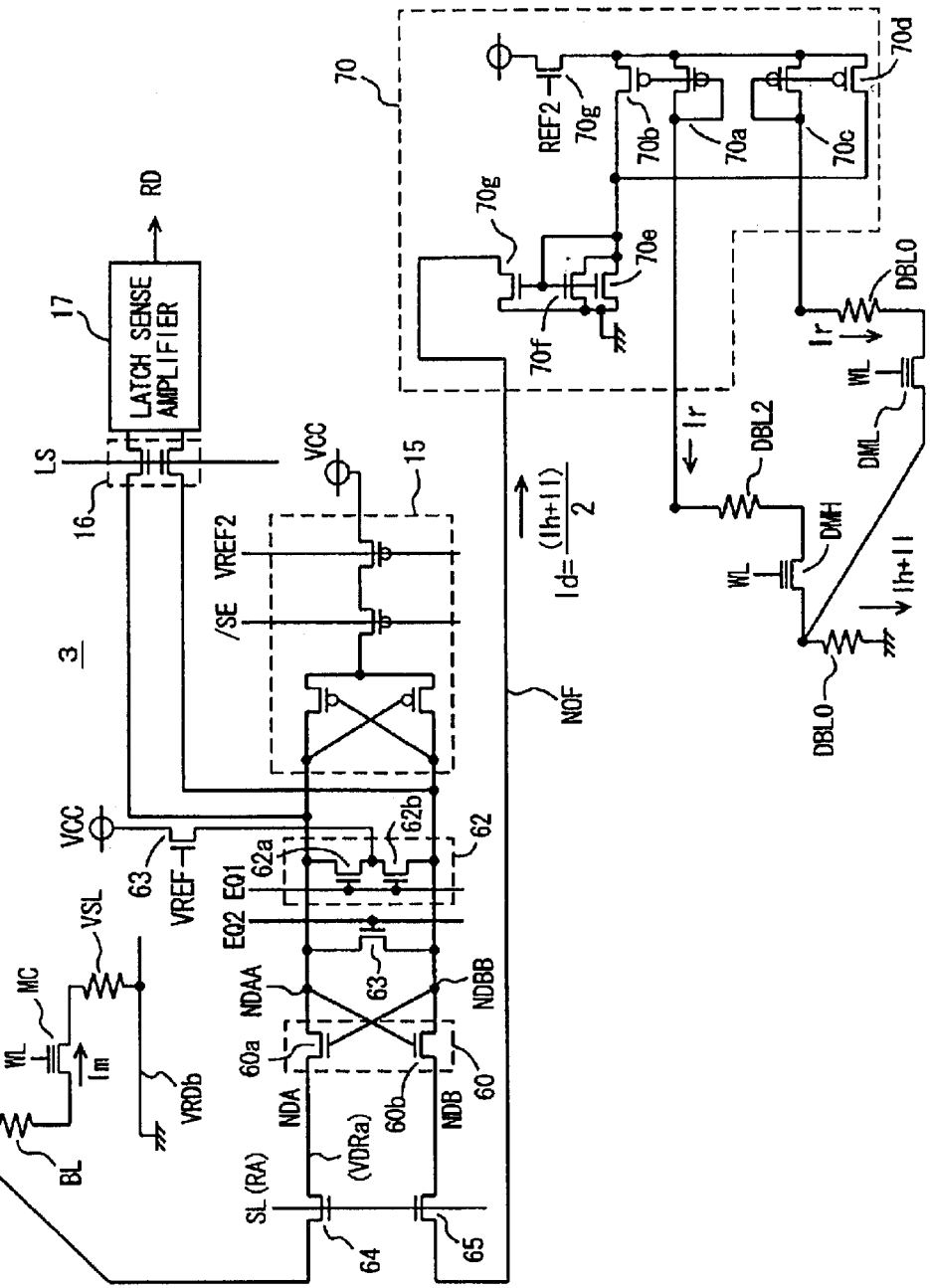
FIG. 10 is a diagram showing a configuration of a main part of a non-volatile semiconductor memory device according to a fifth embodiment of the present invention.

FIG. 10 is a diagram showing a configuration of a main part of a non-volatile semiconductor memory device according to a fifth embodiment of the present invention. In a configuration shown in FIG. 10, current sense amplification circuit 3 includes a constant current supply circuit for supplying a read current to a normal cell. In current sense amplification circuit 3, comparison is performed between a residual current of a read current for a normal cell and a residual current of an average current flowing through dummy cells.

That is, current sense amplification circuit 3 includes: an N-channel MOS transistor 64 rendered conductive in activation of select signal SL, to connect internal read data line VRDa to node NDA; and an N-channel MOS transistor 65 connecting node NDB to a node NDF of current generating circuit 70 according to select signal SL.

Select signal SL applied to the gate of MOS transistor 64 corresponds to read column select signal RA shown in FIG. 1. In FIG. 1, a read column select gate is constituted of a P-channel MOS transistor. In the configuration shown in FIG. 10, a read column select gate is constituted of an N-channel MOS transistor. On the other hand, select signal SL applied to the gate of MOS transistor 65 corresponds to dummy select signal /RAD shown in FIG. 1. A dummy column select gate in the fifth embodiment is constituted of an N-channel MOS transistor.

Therefore, while separate select signals are applied to respective MOS transistors 64 and 65, in FIG. 10, the same select signal is shown being supplied to these MOS transistors 64 and 65, for simplification of the figure. Since read column select signals RA and RAD are generated on the basis of the same timing signal, MOS transistors 64 and 65 are rendered conductive/nonconductive at the same timing.

Current sense amplification circuit 3 includes: a current amplification circuit 60 for adjusting currents flowing through nodes NDA and NDB; an equalizing N-channel MOS transistor 63 equalizing voltages on internal nodes NDAA and NDBB according to equalize instructing signal EQ1; a precharge circuit 62 for precharging internal nodes NDAA and NDBB to a prescribed voltage level according to equalize instructing signal EQ1; and an N-channel MOS transistor 63 supplying a precharge voltage to precharge circuit 62.

Current amplification circuit 60 includes: an N-channel MOS transistor 60a connected between NDA and NDAA, and having a gate connected to node NDBB; and an N-channel MOS transistor 60b connected between NDB and NDBB, and having a gate connected to node NDAA.

Precharge circuit 62 includes: N-channel MOS transistors 62a and 62b for transmitting a current supplied from MOS transistor 63 onto internal nodes NDAA and NDBB in activation of equalize instructing signal EQ1. MOS transistor 63 receives reference voltage VREF at a gate thereof and therefore, precharge circuit 62 precharges internal nodes NDAA and NDBB to a voltage level of voltage VREF−Vth. Here, Vth indicates a threshold voltage of MOS transistor 63.

When internal nodes NDAA and NDBB are in precharged state at a voltage VREF−Vth, MOS transistors 60a and 60b are both conductive to discharge a current from internal nodes NDAA and NDBB to nodes NDA and NDB. Current sense amplification circuit 3 further includes: a differential amplification circuit 15 responsive to activation of sense activation instructing signal /SE, for differentially amplifying voltage of internal nodes NDAA and NDBB; and an isolation gate 16 responsive to latch sense enable signal LS, for selectively connecting internal node NDAA or NDBB to latch sense amplifier 17.

Latch sense amplifier 17 has the same configuration as those shown in the first to fourth embodiments, and includes cross coupled MOS transistors, and performs a sense operation according to the electron confinement scheme when activated.

Differential amplification circuit 15 as well has the same configuration as that shown in the first embodiment, and includes cross coupled P-channel MOS transistors, a constant current transistor and a sense activating transistor.

In the fifth embodiment as well, the connection of internal read data lines VDAa and VRDb with bit line BL and virtual source line VSL is switched according to a right bit/left bit instructing signal. Therefore, in the configuration shown in FIG. 10, internal read data line VRDa corresponds to node NDA.

Current generating circuit 70 includes: an N-channel MOS transistor 70g coupled to power source node, and receiving reference voltage Vref2 at a gate thereof to supply a constant current; a P-channel MOS transistor having a gate and drain connected together, and supplying a supplied current from MOS transistor 70a to dummy cell DMH; a P-channel MOS transistor 70b constituting a current mirror circuit together with MOS transistor 70a; a P-channel MOS transistor 70c supplying a current from MOS transistor 70b to dummy cell DML through dummy bit line DBL0; and a P-channel MOS transistor 70d constituting a current mirror circuit together with MOS transistor 70c. MOS transistor 70c has a gate and source connected together.

In current generating circuit 70, MOS transistors 70a and 70c are connected to dummy bit lines DBL2 and DBL0, respectively, through a dummy column select gate not shown. Dummy cells DMH and DML are coupled to ground node through dummy bit line DBL0.

Current generating circuit 70 further includes: N-channel MOS transistors 70e and 70f receiving currents supplied by MOS transistors 70b and 70d, and having their respective gates connected commonly to each other and the respective drains thereof and their respective drains connected commonly; and an N-channel MOS transistor 70g constituting a current mirror circuit together with MOS transistors 70e and 70f, and discharging a current from node NDF to ground node.

MOS transistors 70e to 70g are the same in size, and therefore, MOS transistor 70g discharges a mirror current with a mirror ratio of ½ of currents flowing in MOS transistors 70e and 70f to ground node from node NDF.

In the configuration of current generating circuit 70 shown in FIG. 10, MOS transistor 70a supplies current Ih flowing through dummy cell DMH and MOS transistor 70c supplies current Il flowing through dummy cell DML. Therefore, current Ih+Il flows in MOS transistors 70e and 70f. MOS transistors 70b and 70d generates a mirror current of currents flowing through respective MOS transistors 70a and 70c. A mirror current supplied by MOS transistors 70b and 70c is a current of a mirror ratio of 1.

MOS transistors 70e and 70f discharge currents from MOS transistors 70b and 70d. MOS transistor 70g drives a current with a mirror ratio of ½ of currents driven by MOS transistors 70e and 70f. Therefore, a current of an average current ID=(Ih+Il)/2 is extracted from node NDF.

Figure 11:
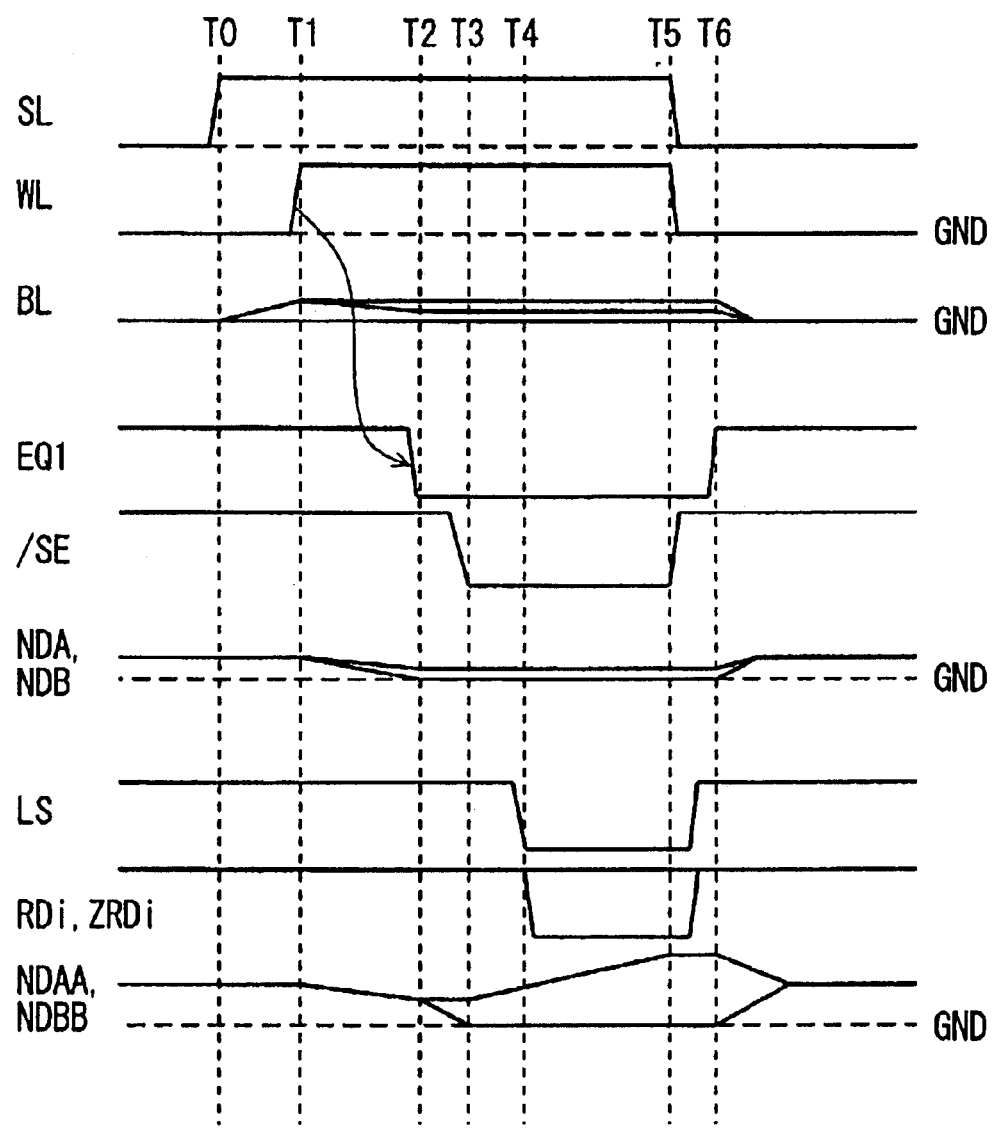
FIG. 11 is a timing diagram representing an operation in the non-volatile semiconductor memory device shown in FIG. 10.
Figure 12:
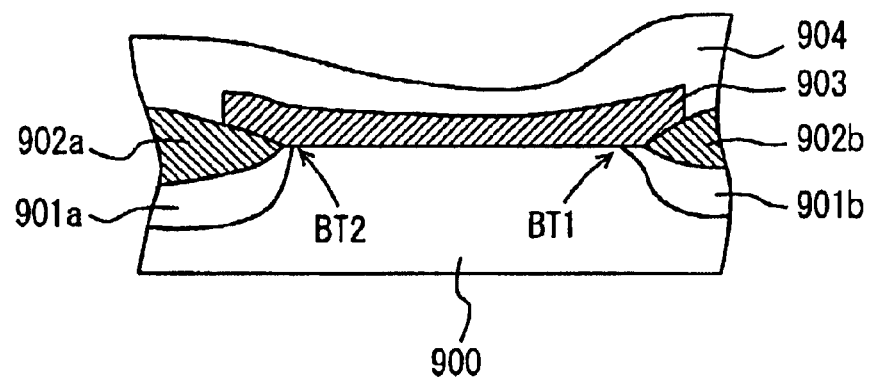
FIG. 12 is a diagram schematically showing a sectional structure of a non-volatile semiconductor memory device.
Figure 13:
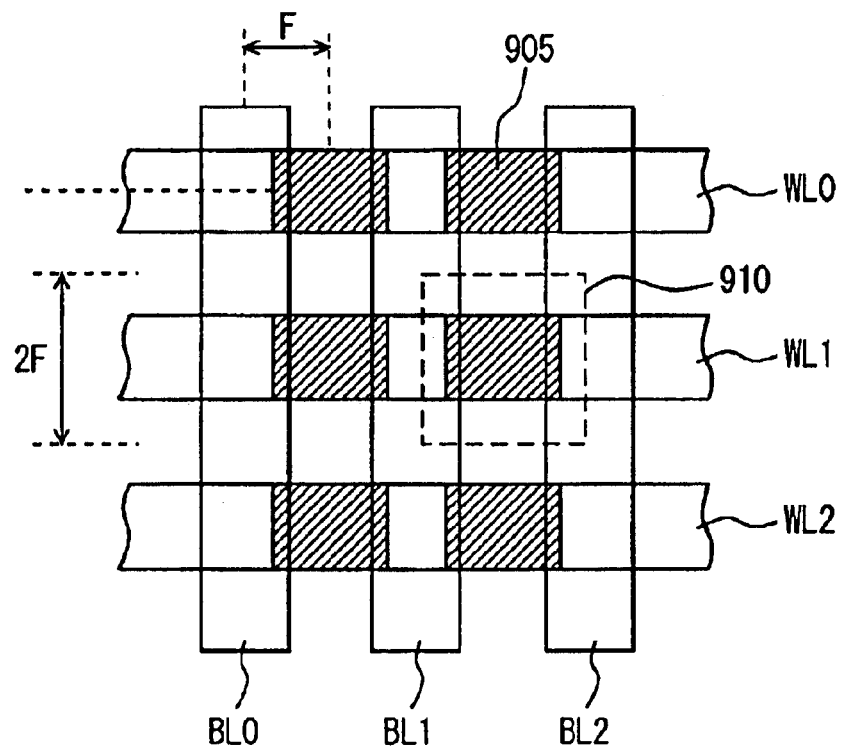
FIG. 13 is a view schematically showing a planar layout of a conventional non-volatile semiconductor memory device.
Figure 14:
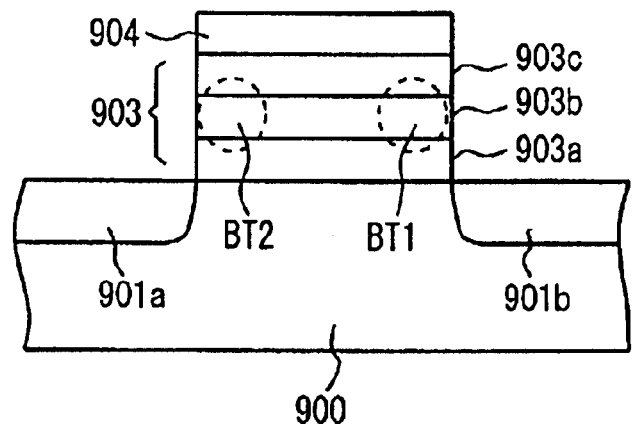
FIG. 14 is an illustration showing a sectional structure of a prior art non-volatile semiconductor memory device and directions of currents in program and data read operations.
Figure 14:
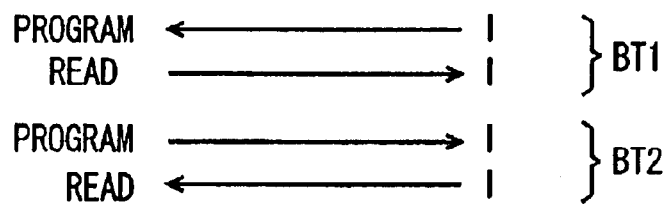
Figure 15:
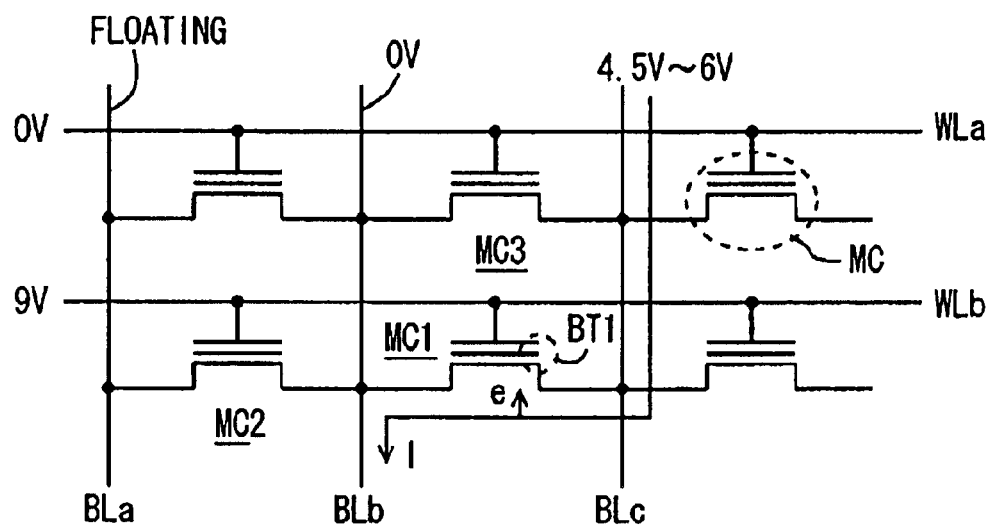
FIG. 15 is a diagram showing applied voltages in programming of a conventional non-volatile memory cell.
Figure 16:
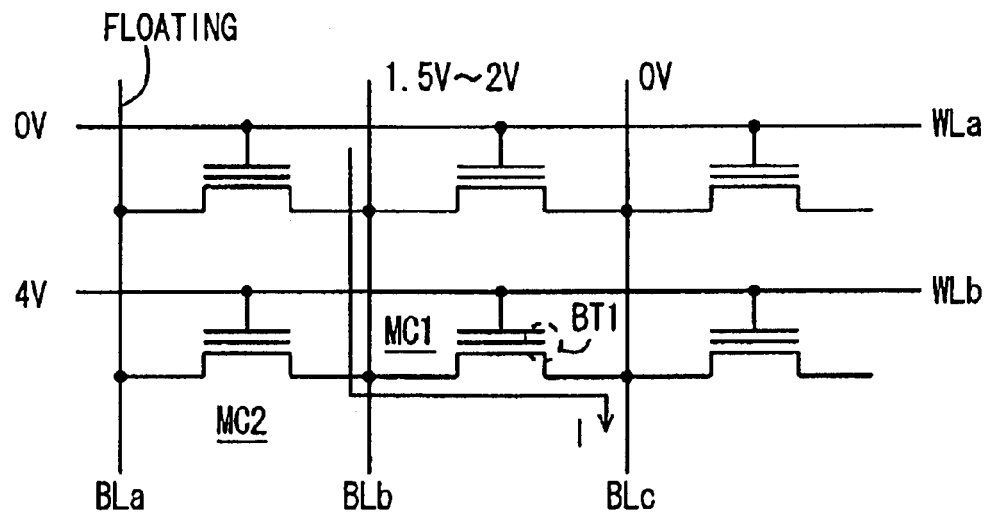
FIG. 16 is a diagram showing applied voltages in data reading in a conventional non-volatile memory cell.
Figure 17:
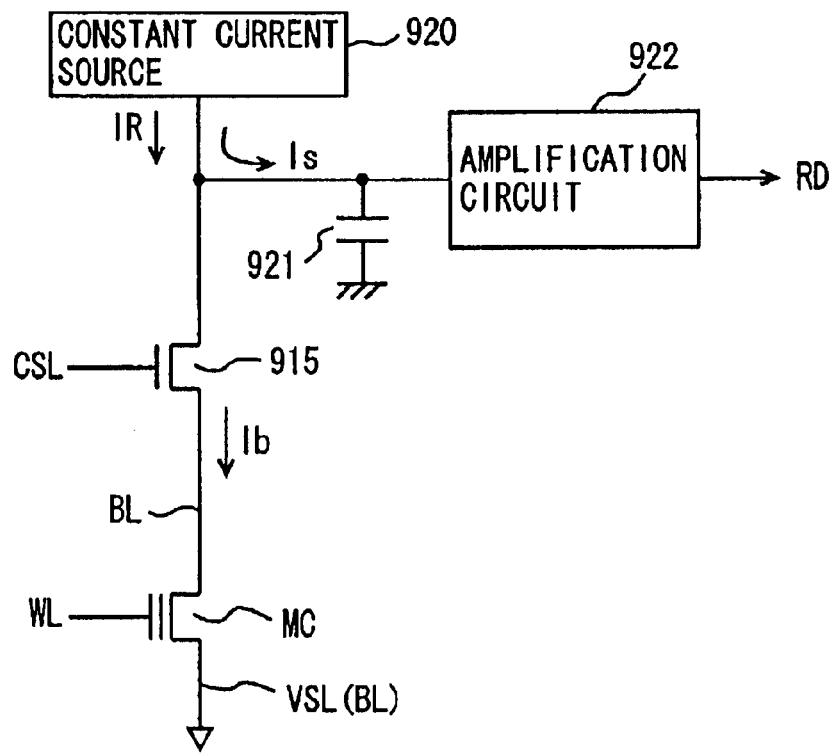
FIG. 17 is a diagram schematically showing a configuration of data reading section in a conventional non-volatile semiconductor memory device.
Figure 18:
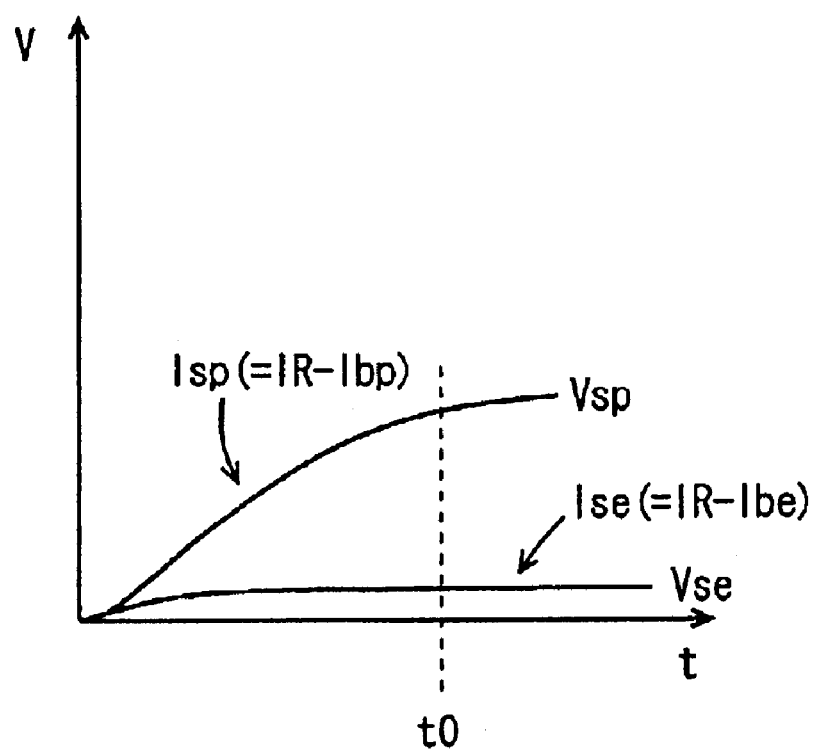
FIG. 18 is a graph showing an internal read voltage margin of a conventional non-volatile semiconductor memory device.

Current sense amplification circuit 3 performs an amplification operation to generate internal read data according to current (Ih+Il)/2 extracted by current generating circuit 70 and current Im driven by normal cell MC. Now, with reference to the operation timing diagram shown in FIG. 11, description will be given of operation the a circuit shown in FIG. 10.

In standby state prior to time T0, equalize instructing signal EQ1 is at H level, MOS transistors 63, 62a and 62b are in conductive state and internal node NDAA and NDBB are precharged to and equalized at a voltage level determined by MOS transistor 63. In current amplification circuit 60, MOS transistors 60a and 60b are set in on state, nodes NDA and NDB are precharged to a voltage level (less by a value corresponding to a threshold voltage) determined by MOS transistors 60a and 60b.

Select signal SL is at L level in non-selected state. Latch sense enable signal LS is at H level and isolation gate 16 is in a conductive state. Sense amplification circuit 15 maintains an inactive state since sense activation instructing signal /SE is at H level.

At time T0, a memory cell select operation is started. At time T0, select signal SL attains H level and MOS transistors 64 and 65 enter the on state. When select signal SL is driven to H level, a current is supplied through MOS transistor 60a to raise a voltage level of bit line BL. Since a current is also similarly supplied to node NDF, a voltage level of node NDF rises. In this case, since word line WL is not selected yet, MOS transistor 70g in current generating circuit 70 is in non-conductive state and only charging of node NDF is performed.

At time T1, word line WL is driven to selected state, a memory cell current Im according to stored data flows into normal cell MC, and currents Ih and Il flow into respective dummy cells DMH and DML. Therefore, average current (Ih+Il)/2 is discharged from node NDB through node NDF by current generating circuit 70 and memory cell current Im is discharged through bit line BL. A voltage level of bit line BL is determined according to stored data in selected normal cell MC. A potential difference between nodes NDA and NDB is caused according to a difference between memory cell current Im and average current (Ih+Il)/2. Since equalize instructing signal EQ1 is at H level, voltage levels of nodes NDAA and NDBB are lowered by the discharging operation.

At time T2, equalize instructing signal EQ1 is pulled down to L level to set MOS transistors 62a, 62b and 63 to the non-conductive state. With such an operation, precharge and equalize operations on internal nodes NDAA and NDBB are completed, and voltage levels of nodes NDAA and NDBB change at high speed according to memory cell current Im and average current (Ih+Il)/2 to increase a difference in potential between internal nodes NDAA and NDBB.

When memory cell current Im is larger than average current Id, a voltage level of node NDAA is lowered at a speed higher than that of node NDBB and to cause a conductance of MOS transistor 60b to reduce at high speed, finally to be set into non-conductive state. A potential difference between internal nodes NDAA and NDBB is increased at high speed in response to deactivation of equalize instructing signal EQ1. Internal node NDAA or NDBB, whichever drives a larger current, is finally discharged to ground voltage level.

At time T3, sense activation instructing signal /SE is activated, to activate a sense amplification circuit 15 for raising a potential of internal node NDAA or NDBB, whichever is higher in potential. A sense operation in sense amplification circuit 15 is comparatively moderate due to reference voltage VREF2 and rise in potential of internal node NDAA or NDBB with a higher potential is also moderate.

A sense operation by differential amplification circuit 15 can be performed in an optimal operating region according to setting of a voltage level of reference voltage VREF, thereby enabling a sense operation at high speed with correctness.

At time T4, latch sense enable signal LS is set to L level to render isolation gate 16 non-conductive and to activate latch sense amplifier 17, and a sense operation is performed along the electron confinement scheme to perform a differential amplification operation according to charges confined in latch sense amplifier 17, to generate internal read data RD and ZRDi(RD) at high speed.

After reading of memory cell data is completed, word line WL and select signal SL are driven, at time T5, to the non-selected state to deactivate sense activation instructing signal /SE. Responsively, supply of memory cell current Im and average current Id are cut off. Then, latch sense enable signal LS is driven to H level to couple internal nodes NDAA and NDBB to latch sense amplifier 17.

At time T6, equalize instructing signal EX1 is set to H level, MOS transistors 62a, 62b and 63 are all rendered conductive, an equalize operation is performed on internal nodes NDAA and NDBB and in response, voltage levels of nodes NDA and NDB are equalized to a voltage level (VREF−Vth) determined by reference voltage VREF.

Therefore, with the above architecture in which a memory cell current and an average current are extracted from a current sense amplification circuit, a precharge potential on internal nodes of the current sense amplification circuit can be changed to generate a potential difference according to a difference between the memory cell current and the average current, thereby enabling high speed generation of internal read data.

According to the fifth embodiment, as described above, a memory cell current and dummy currents are supplied from a current sense amplification circuit to generate a signal corresponding to a difference of the supplying currents for generating an internal read data, thereby enabling high speed generation of internal read data.

A memory cell current is generated according to a reference voltage in a current sense amplification circuit, and a potential of an internal node of the current sense amplification circuit can be set to an optimal value according to the reference voltage to perform a sense operation with correctness.

[Other Modifications]

In the above configuration, dummy cells and normal cells are arranged in the same memory cell array. However, the dummy cells and normal cells may be placed in separate regions. A dummy cell storing H level data and a dummy cell storing L level data are formed, a current with a magnitude of the average of read currents flowing in the dummy cells is generated and compared with a current flowing in a selected memory cell. In a case where dummy cells and normal cells are placed in separate regions, only a minimum required number of dummy cells are required, to reduce the array area. Furthermore, in this case, an interconnection layout is simply set such that a relationship between a resistance and capacitance for a selected normal cell is the same as that for a dummy cell.

In the above description, description is made of an insulating film trapping non-volatile memory cell storing information by trapping charges in an insulating film such as a nitride film. However, the present invention can be similarly applied to a non-volatile memory cell storing data by injecting electrons into a floating gate made of, for example, polysilicon.

As for operation control for performing writing and reading of data, generation of write, erase and read voltages and control of an operation sequence thereof has only to be controlled in software manner using a sequence controller or CPU (central processing control), as is used in a general collective erase type or flash type non-volatile memory cell.

Note that in the configuration shown in FIG. 1, a read column select gate is constituted of P-channel MOS transistors. The read column select gate, however, may be constituted of N-channel MOS transistors.

According to the present invention, as described above, there are generated a read current corresponding to a current flowing in a memory cell and an average current flowing dummy cells storing H level data and L level data according to a current sense scheme, to generate internal read data according to a relationship between the memory cell data and the average current. Thus, internal read data can be generated according the current sense scheme.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:

a plurality of non-volatile memory cells, arranged in rows and columns, each storing data in a non-volatile manner and including an insulated gate transistor having a threshold voltage set according to stored data, said threshold voltage having at least a first state corresponding to a data at a first logical level and a second state corresponding to data at a second logical level;

a plurality of bit lines provided corresponding to the memory cell columns, and connected to the memory cells on corresponding columns;

read current generating circuitry for supplying a current to a bit line of a selected column, in data reading;

reference current generating circuitry for generating a reference current, said reference current, with respect to a read current flowing from said read current generating circuitry into the bit line of the selected column, having a magnitude of an average of a first read current corresponding to a current flowing through said bit line of the selected column from said read current generating circuitry when a memory cell in said first state is selected and a second read current corresponding to a current flowing through said bit line of the selected column from said read current generating circuitry when a memory cell in said second state is selected;

comparison circuitry, coupled to said read current generating circuitry and said reference current generating circuitry, for comparing the reference current from said reference current generating circuitry with a residual current except a current flowing into the bit line on the selected column in the current generated from said read current generating circuitry to generate an output signal corresponding to a result of comparison, the first and second read currents each corresponding to a residual current except the current flowing through the selected memory cell in the current generated by said read current generating circuitry; and internal read circuitry for generating internal read data according to the output signal of said comparison circuitry.

2. The non-volatile semiconductor memory device according to claim 1, wherein said reference current generating circuitry includes:

a first dummy cell having a threshold voltage in said first state;

a second dummy cell having a threshold voltage in said second state;

a current supply/detection circuit for supplying a current, corresponding in magnitude to the current supplied by said read current generating circuitry, to each of the first and second dummy cells and for generating a mirror current of the supply current to the first and second dummy cells; and a subtraction circuit for generating said reference current by subtracting said mirror current from a current corresponding in magnitude to the current driven by said read current generating circuitry, and said comparison circuitry includes:

a signal line provided in parallel to the selected column, and receiving the residual current from said read current generating circuitry; and a comparator for comparing the current driven by said subtraction circuit with the current on said signal line.

3. The non-volatile semiconductor memory device according to claim 1, wherein said internal read circuitry further includes a sense latch circuit for sensing, amplifying and latching the output signal of said comparison circuitry.

4. The non-volatile semiconductor memory device according to claim 1, wherein said reference current generating circuitry includes:

a first dummy cell having a threshold voltage in said first state;

a second dummy cell having a threshold voltage in said second state;

a current supply circuit for supplying currents to the first and second dummy cells;

a current drive circuit, coupled to said current supply circuit in parallel to the first and second dummy cells, for driving the current from said current supply circuit; and an intermediate current generating circuit for generating a mirror current of the driven current by said current drive circuit as said reference current, and said comparison circuitry includes:

a signal line, coupled to said read current generating circuitry in parallel to the bit line of a selected column, for receiving the residual current from said read current generating circuitry; and a comparator for comparing the current flowing through said signal line with said mirror current to output a signal corresponding to a result of comparison.

5. The non-volatile semiconductor memory device according to claim 4, wherein said intermediate current generating circuit includes:

a current mirror transistor for generating the mirror current of the driven current by said current drive circuit; and a current source for supplying a current to said current mirror transistor, said current source supplying a mirror current of said mirror current to said comparison circuit.

6. The non-volatile semiconductor memory device according to claim 1, wherein said reference current generating circuitry includes:

a first dummy cell having a threshold voltage in said first state;

a second dummy cell having a threshold voltage in said second state;

a current supply circuit for supplying currents to the first and second dummy cells; and a mirror circuit for generating a mirror current of the currents flowing in said first and second dummy cells, and said comparison circuit receives the residual current other than a current flowing through a selected memory cell in the current generated by said read current generating circuitry to make a comparison with the current supplied from said mirror circuit.

7. The non-volatile semiconductor memory device according to claim 6, further comprising a connection circuit for coupling said mirror current to said comparison circuit in response to driving of said selected memory cell to a selected state.

8. The non-volatile semiconductor memory device according to claim 1, wherein said comparison circuitry includes:

a precharge circuit for precharging first and second internal nodes to a prescribed voltage when activated;

an equalize circuit for equalizing voltages on said first and second internal nodes when activated, said equalize circuit being deactivated after deactivation of said precharge circuit;

a current amplification circuit for driving said first and second internal nodes according to said read current and the reference current; and a differential amplification circuit for differentially amplifying voltages on said first and second internal nodes.

9. The non-volatile semiconductor memory device according to claim 8, wherein said current amplification circuit includes a pair of insulated gate field effect transistors having their respective gates and their respective first conduction terminals cross-connected to said first and second internal nodes.

10. A non-volatile semiconductor memory device comprising:

a plurality of non-volatile memory cells, arranged in rows and columns, each storing data in a non-volatile manner and each including an insulated gate transistor having a threshold voltage set according to stored data, the threshold voltage including at least a first threshold voltage corresponding to stored data at a first logical level and a second threshold voltage corresponding to stored data at a second logical level;

a plurality of bit lines, provided corresponding to the memory cell columns, each connected to the memory cells on a corresponding column; and reference current generating circuitry for generating a reference current, said reference current, in data reading, having a magnitude of an average of a first current flowing through a memory cell having said first threshold voltage when said memory cell having said first threshold voltage is selected and a second current flowing through a memory cell having said second threshold voltage when said memory cell having said second threshold voltage is selected;

constant current generating circuitry for generating a constant current having a prescribed magnitude;

comparison circuitry for supplying said constant current into a bit line of a selected column as a read current and generating an output signal corresponding to a difference between said read current and said reference current; and internal read circuitry for generating internal read data according to the output signal of said comparison circuitry.

11. The non-volatile semiconductor memory device according to claim 10, wherein said reference current generating circuitry includes:

a first dummy cell having the first threshold voltage;

a second dummy cell having the second threshold voltage;

a current supply circuit for supplying currents to the first and second dummy cells and generating a mirror current of the currents flowing in said first and second dummy cells; and a current mirror circuit for generating a further mirror current of the mirror current supplied by said current supply circuit to generate said reference current.

12. The non-volatile semiconductor memory device according to claim 10, wherein said comparison circuitry includes:

a precharge circuit for supplying a constant current from said constant current generating circuitry to first and second internal nodes, when activated;

an equalize circuit for equalizing potentials on said first and second nodes when activated;

a first transistor coupled between the bit line of a selected column and the first internal node and supplying said constant current to the bit line on the selected column; and a second transistor coupled between the second internal node and an output node of said reference current generating circuitry and supplying said constant current to the reference current generating circuitry, the first and second transistors being cross coupled with respect to the first and second internal nodes, and said reference current generating circuitry sinks said reference current from said comparison circuitry.

13. The non-volatile semiconductor memory device according to claim 12, wherein said precharge circuit and said equalize circuit are deactivated after passage of a prescribed time period since selection of a memory cell.

14. The non-volatile semiconductor memory device according to claim 12, wherein said comparison circuitry further includes a differential amplification circuit, activated in response to a sense activation signal, for differentially amplify voltages on said first and second internal nodes.

15. The non-volatile semiconductor memory device according to claim 12, wherein said internal data read circuitry includes a latch amplification circuit for sensing, amplifying and latching voltages on said first and second internal nodes to generate the internal read data.

16. A non-volatile semiconductor memory device comprising:

plural memory cells, arranged in rows and columns, each including a memory transistor having a threshold voltage changing according to stored data, said threshold voltage including at least a first state corresponding to data at a first logical level and a second state corresponding to data at a second logical level;

a plurality of bit lines, provided corresponding to the memory cell columns, each connected to the memory cells on a corresponding column;

read current supply current circuitry for supplying a constant current to the bit line of a selected column;

reference current generating circuitry for generating a reference current, said reference current generating circuitry including a first dummy cell having a first threshold voltage corresponding to the first state, a second dummy cell having a threshold voltage corresponding to the second state, and a current supply/averaging circuit for supplying the constant current to the first and second dummy cells and averaging the currents flowing through the first and second dummy cells to generate said reference current; and current comparison circuitry coupled to receive a current passing through a selected memory cell on the selected column and said reference current, for comparing the current having flowed through said selected memory cell with said reference current and generating a signal indicating a result of comparison.

17. The non-volatile semiconductor memory device according to claim 16, wherein each bit line is shared between the memory cells on adjacent columns, said non-volatile semiconductor memory device further comprises, a select circuit according to an address signal, for selecting first and second bit lines provided corresponding to the selected column, and connecting said first bit line to said read current supply circuitry and connecting said second bit line to said current comparison circuitry.

18. A non-volatile semiconductor memory device comprising:

a plurality of non-volatile memory cells, arranged in rows and columns, each storing information in a non-volatile manner and each including a transistor having a threshold voltage set according to stored information;

a plurality of bit lines, provided corresponding to the columns and connected to memory cells on corresponding columns, each shared between the memory cells on adjacent columns;

current supply circuitry coupled to a first bit line of a selected column, for supplying a constant current into said first bit line; and a sense amplifier coupled to a second bit line of said selected column, for generating internal read data according to a current flowing through said second bit line and a reference current, said sense amplifier including a sense latch circuit for sensing, amplifying and latching a result of comparison between the current flowing through said second bit line and the reference current, to generate said internal read data.

19. A non-volatile semiconductor memory device comprising:

a plurality of non-volatile memory cells, arranged in rows and columns, each storing information in a non-volatile manner and each including a transistor having a threshold voltage set according to stored information;

a plurality of bit lines, provided corresponding to the columns and connected to the memory cells on corresponding columns, each shared between the memory cells on adjacent columns;

current supply circuitry coupled to a first bit line of a selected column, for supplying a current into the first bit line;

reference power supply coupled to a second bit line of said selected column; and a sense amplifier coupled to said first bit line in parallel to said current supply circuitry, for generating internal read data according to a supplied current in data reading.

* * * * *